(12) United States Patent
Lin et al.

(10) Patent No.: US 12,707,665 B2
(45) Date of Patent: Aug. 11, 2026

(54) SEMICONDUCTOR STRUCTURE AND METHOD OF FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Chun-Sheng Liang, Hsinchu (TW); Chun-Wing Yeung, Hsinchu (TW); Chih-Hao Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 671 days.

(21) Appl. No.: 18/153,646

(22) Filed: Jan. 12, 2023

(65) Prior Publication Data

US 2024/0088278 A1 Mar. 14, 2024

Related U.S. Application Data

(60) Provisional application No. 63/405,994, filed on Sep. 13, 2022.

(51) Int. Cl.

| | |
|---|---|
| ***H10D 30/43*** | (2025.01) |
| ***H10D 30/01*** | (2025.01) |
| ***H10D 30/67*** | (2025.01) |
| ***H10D 62/10*** | (2025.01) |
| ***H10D 62/13*** | (2025.01) |

(52) U.S. Cl.

CPC ........... *H10D 30/43* (2025.01); *H10D 30/014* (2025.01); *H10D 30/6735* (2025.01); *H10D 62/121* (2025.01); *H10D 62/151* (2025.01)

(58) Field of Classification Search

CPC ... H10D 30/43; H10D 30/014; H10D 30/6735
See application file for complete search history.

(56) References Cited

U.S. PATENT DOCUMENTS

| | | | | |
|---|---|---|---|---|
| 2019/0386099 A1* | 12/2019 | Kim | H10D 62/115 | |
| 2022/0102520 A1* | 3/2022 | Shiliang | H10D 30/6757 | |
| 2023/0187514 A1* | 6/2023 | Zhou | H10D 62/121 | 257/288 |

* cited by examiner

*Primary Examiner* — Brian Turner
(74) *Attorney, Agent, or Firm* — Birch, Stewart, Kolasch & Birch, LLP

(57) ABSTRACT

A semiconductor structure includes spaced apart first and second fins over a substrate, a separating wall over the substrate and having opposite first and second wall surfaces, multiple first channel features extending away from the first wall surface over the first fin such that the first channel features are spaced apart, multiple second channel features extending away from the second wall surface over the second fin such that the second channel features are spaced apart, two spaced apart first epitaxial structures on the first fin such that each first channel feature interconnects the first epitaxial structures, two spaced apart second epitaxial structures on the second fin such that each second channel feature interconnects the second epitaxial structures, and a dielectric structure including at least one bottom dielectric portion separating at least one of the first and second epitaxial structures from a corresponding first and second fins.

20 Claims, 27 Drawing Sheets

SEMICONDUCTOR STRUCTURE AND METHOD OF FORMING THE SAME

REFERENCE TO RELATED APPLICATION

This application claims priority of U.S. Provisional Patent Application No. 63/405,994, filed on Sep. 13, 2022, the contents of which is incorporated herein by reference in its entirety.

BACKGROUND

Currently, semiconductor devices are widely used in various fields, such as cloud storage, medicine, transportation, mobile devices, etc. The current trend in some aspects of semiconductor device manufacturing focuses on providing semiconductor devices with smaller dimensions and better power efficiency. Therefore, it is desirable to continuously improve the structure and manufacturing of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
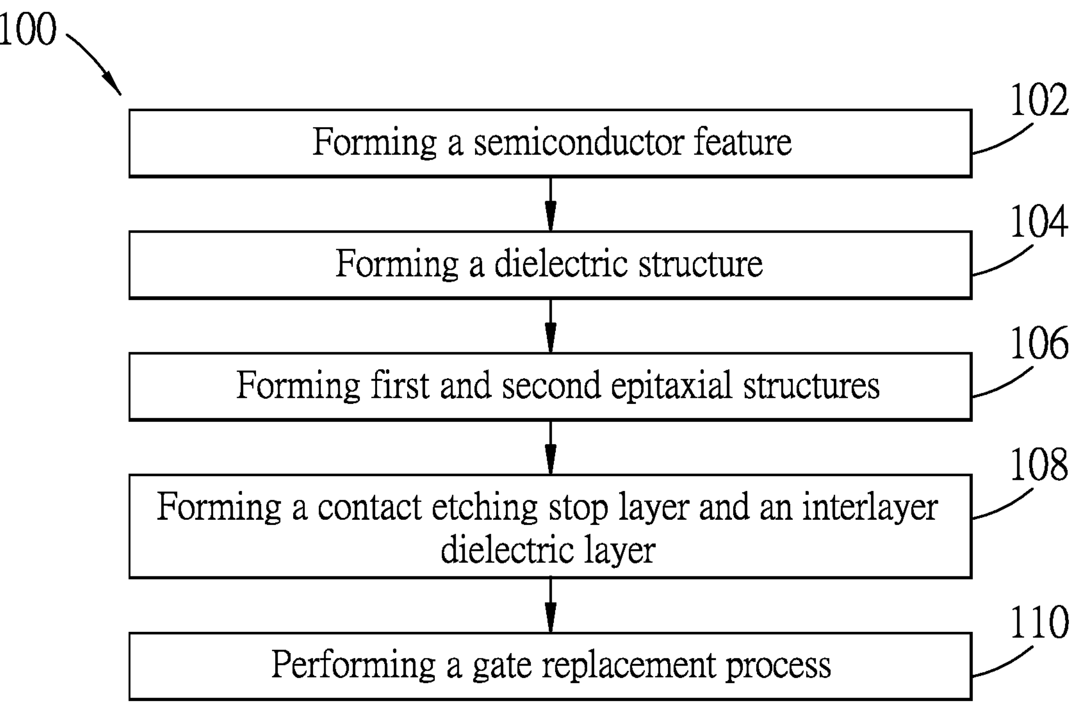
FIG. 1 illustrates a method for forming a semiconductor structure in accordance with some embodiments of this disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for forming a semiconductor structure 200 (see FIGS. 34 and 35) in accordance with some embodiments. FIGS. 2 to 35 are schematic views showing intermediate stages of the method 100 as depicted in FIG. 1. Additional steps which are not limited to those described in the method 100, can be provided before, during or after forming the semiconductor structure 200, and some of the steps described herein may be replaced by other steps or be eliminated. Similarly, additional features may be present, and/or features present may be replaced or eliminated in additional embodiments.

Figure 12:
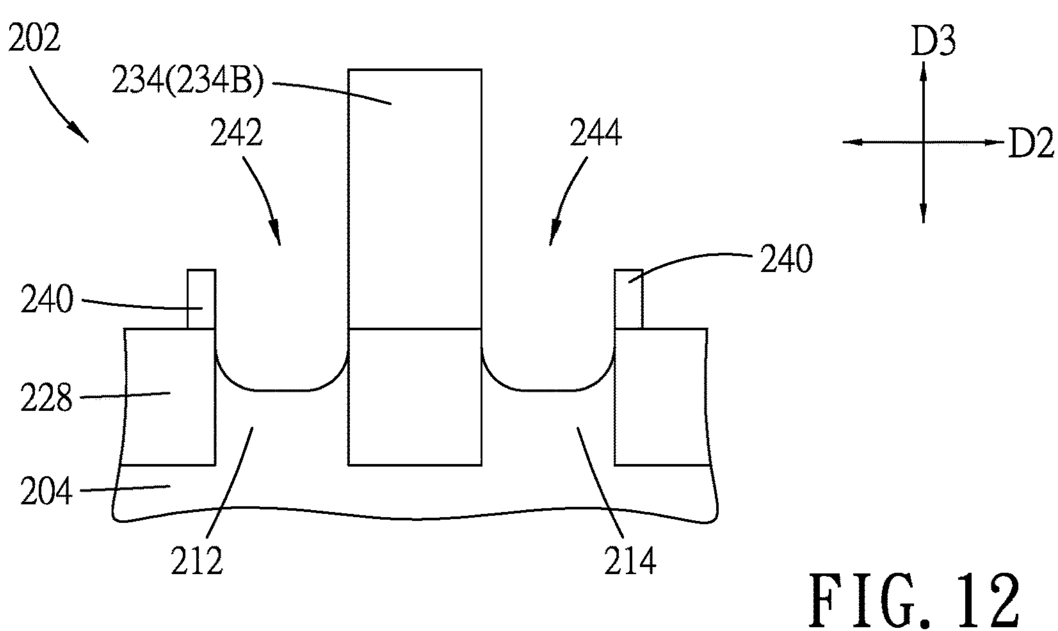
Figure 13:
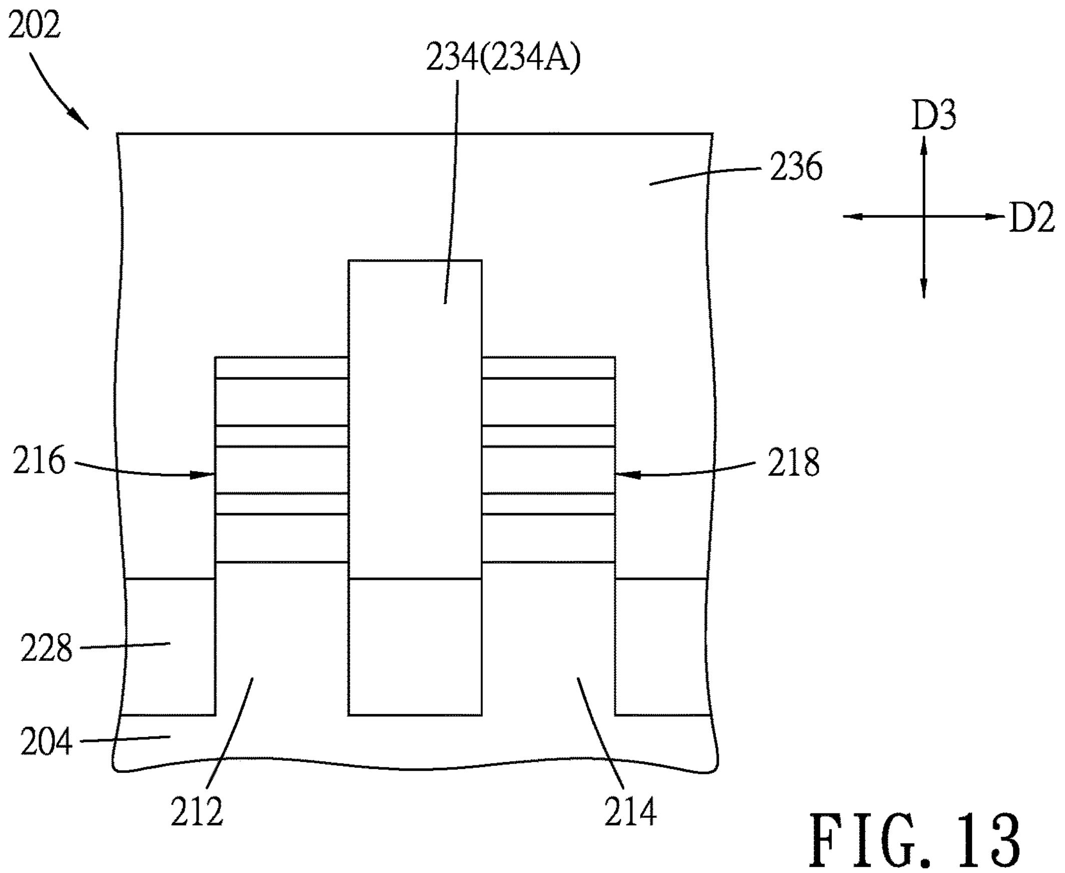

Referring to FIG. 1, in a step 102 of the method 100, a semiconductor feature is formed. FIGS. 12 and 13 respectively illustrate different cross-sectional views of the semiconductor feature 202 in accordance with some embodiments. In some embodiments, step 102 includes sub-steps 1021 to 1028.

Figure 2:
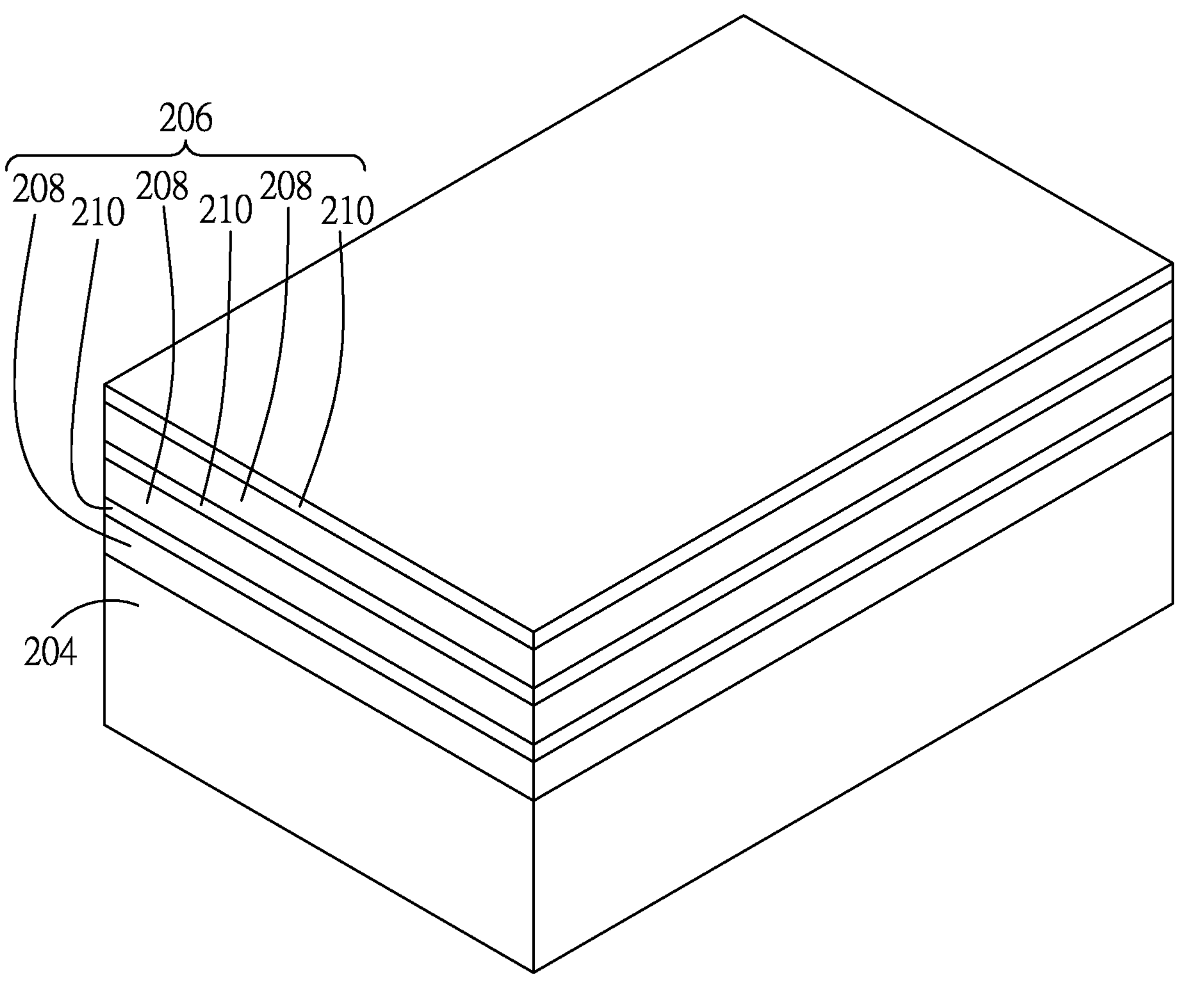
FIGS. 2 to 35 show intermediate steps of a method for forming a semiconductor structure in accordance with some embodiments of this disclosure.

In sub-step 1021, referring to FIG. 2, in some embodiments, in the process of forming the semiconductor feature 202 (see FIGS. 12 and 13), a stacked structure 206 is formed over a substrate 204, where the stacked structure 206 includes a plurality of sacrificial layers 208 and a plurality of channel layers 210 that are alternatingly stacked over one another.

In some embodiments, the substrate 204 may include, for example, but not limited to, an elemental semiconductor or a compound semiconductor. The elemental semiconductor includes a single species of atoms, such as Si or Ge in column XIV of the periodic table, and may be a crystalline, polycrystalline, or amorphous structure. Other suitable materials are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the composition ratio thereof changes from one location to another location in the compound semiconductor. The compound semiconductor may be formed over a silicon substrate, and the compound semiconductor may be strained. In some embodiments, the substrate 204 may include a multilayer compound semiconductor structure. In some embodiments, the substrate 204 may be a semiconductor-on-insulator (SOI) (e.g., silicon germanium-on-insulator (SGOI)). Generally, an SOI substrate includes a layer of a semiconductor material such as epitaxial silicon, germanium, silicon germanium, or any combination thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure.

In some embodiments, the sacrificial layers 208 may be made of a material that can be readily etched while the channel layers 210 may be made of a material that is capable of withstanding the etchant used for removing the sacrificial layers 208. In some embodiments, the sacrificial layers 208 may be made of SiGe while the channel layers 210 may be made of Si. In some embodiments, the numbers of the sacrificial layers 208 and the channel layers 210 may be changed according to practical requirements.

Figure 3:
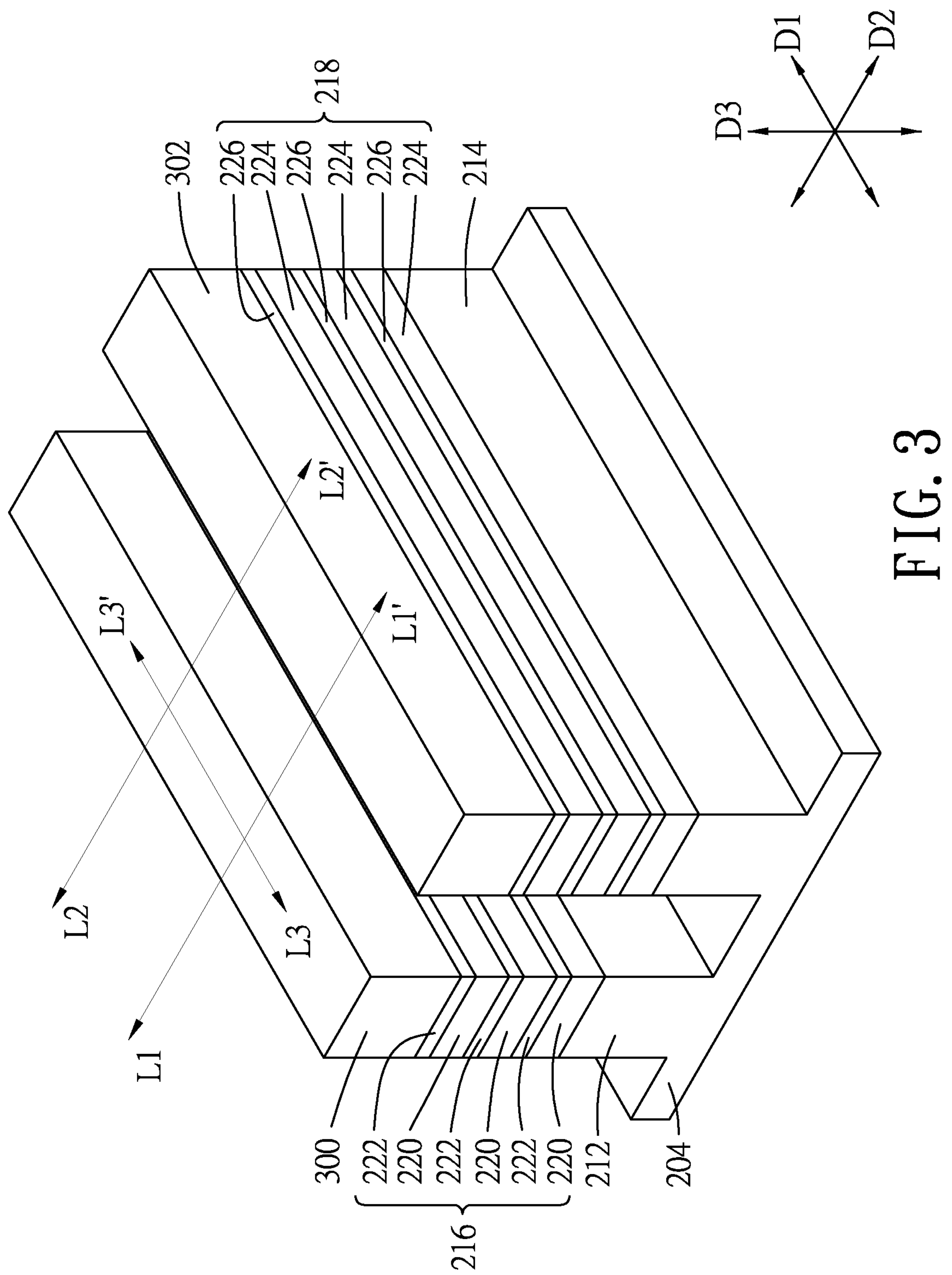

In sub-step 1022, referring to FIGS. 2 and 3, in some embodiments, portions of the substrate 204 may be etched to form a first fin 212 and a second fin 214. In some embodiments, the first and second fins 212, 214 are disposed over the substrate 204, extend along a first direction (D1), and are separated from each other along a second direction (D2) which is transverse to the first direction (D1). In some embodiments, portions of the stacked structure 206 may be etched to form a first stacked structure 216 that is disposed over the first fin 212, and a second stacked structure 218 that is disposed over the second fin 214. In some embodiments, the first stacked structure 216 includes a plurality of first sacrificial features 220 which are parts of the sacrificial layers 208 of the stacked structure 206, and a plurality of first channel features 222 which are parts of the channel layers 210 of the stacked structure 206, where the first sacrificial features 220 and the first channel features 222 are alternatingly stacked over one another along a third direction (D3) which is transverse to the first and second directions (D1, D2). In some embodiments, the first, second and third directions (D1, D2, D3) are perpendicular to one another. In some embodiments, the second stacked structure 218 includes a plurality of second sacrificial features 224 which are parts of the sacrificial layers 208 of the stacked structure 206, and a plurality of second channel features 226 which are parts of the channel layers 210 of the stacked structure 206, where the second sacrificial features 224 and the second channel features 226 are alternatingly stacked over one another along the third direction (D3). In some embodiments, the substrate 204 and the stacked structure 206 may be etched at the same time, or may be etched separately. In some embodiments, first and second hardmasks 300, 302 may be used as etching masks for etching the substrate 204 and the stacked structure 206. In some embodiments, each of the first and second hardmasks 300, 302 may be made by chemical vapor deposition (CVD), atomic layer deposition (ALD), or other suitable techniques, and may be a single layer or multiple layers each made of a suitable low k material (e.g., silicon oxide ($SiO_x$), silicon nitride ($SiN_x$), silicon oxynitride (SiON), silicon carbonitride (SiCN), silicon oxycarbide (SiOC), silicon oxycarbonitride (SiOCN), silicon carbide (SiC), etc.), a suitable high k material (e.g., hafnium oxide (e.g., $HfO_2$), zirconium oxide (e.g., $ZrO_2$), zirconium aluminum oxide (ZrAlOx), hafnium aluminum oxide (HfAlOx), hafnium silicon oxide (HfSiOx), aluminum oxide (e.g., $Al_2O_3$), etc.), or other suitable materials. In some embodiments, each of the first and second sacrificial features 220, 224 may have a thickness that is measured along the third direction (D3) and that ranges from about 5 nm to about 30 nm, but other ranges of value are also within the scope of this disclosure. In some embodiments, each of the first and second channel features 222, 226 may have a thickness that is measured along the third direction (D3) and that ranges from about 5 nm to about 30 nm, but other ranges of value are also within the scope of this disclosure. Although it is shown in FIG. 3 that the thickness of each of the first and second sacrificial features 220, 224 is greater than that of each of the first and second channel features 222, 226, the thickness of each of the first and second sacrificial features 220, 224 may be equal to or smaller than that of each of the first and second channel features 222, 226 according to practical requirements. In some embodiments, each of the first and second stacked structures 216, 218 may have a width that is measured along the second direction (D2) and that ranges from about 5 nm to about 100 nm, but other ranges of value are also within the scope of this disclosure. In some embodiments, a distance measured along the second direction (D2) between the first and second stacked structures 216, 218 may range from about 10 nm to about 40 nm, but other ranges of value are also within the scope of this disclosure.

Figure 4:
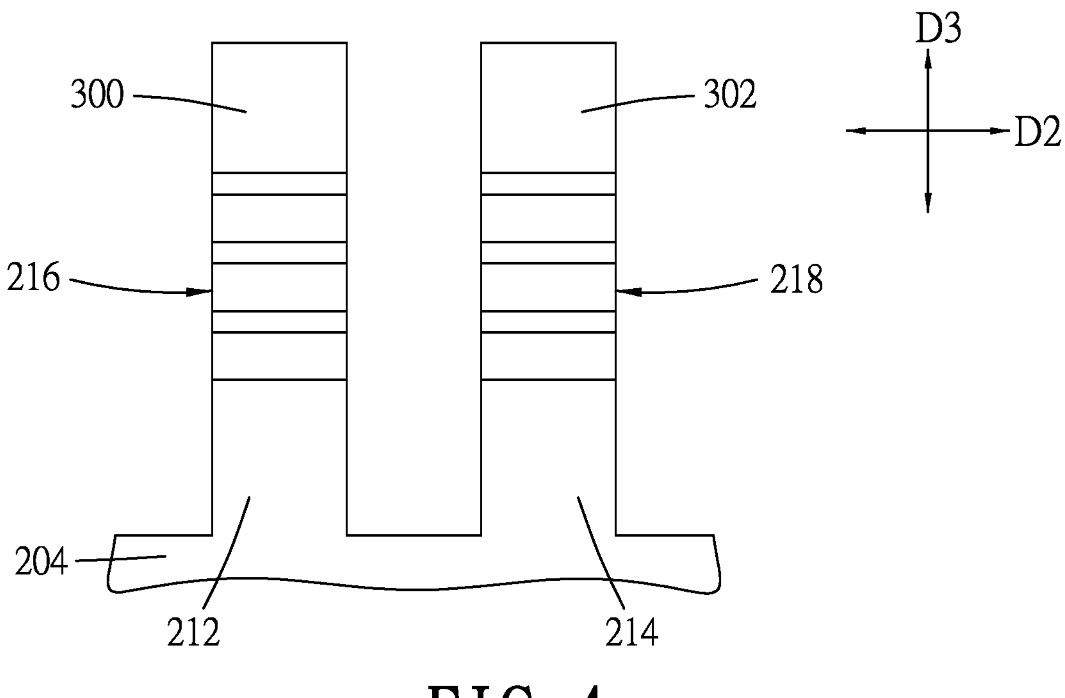

Along line L1-L1' of FIG. 3, exposed portions of the first and second stacked structures 216, 218, which are designed to be exposed from a subsequently formed structure (e.g., a dummy gate structure and gate spacers at two opposite sides of the dummy gate structure), can be shown; along line L2-L2' of FIG. 3, covered portions of the first and second stacked structures 216, 218, which are designed to be covered by a portion of the subsequently formed structure, can be shown; and along line L3-L3' of FIG. 3, the exposed and covered portions of the first stacked structure 216 can be shown. FIG. 4 is a schematic sectional view taken from either line L1-L1' or line L2-L2' of FIG. 3 in accordance with some embodiments.

Figure 5:
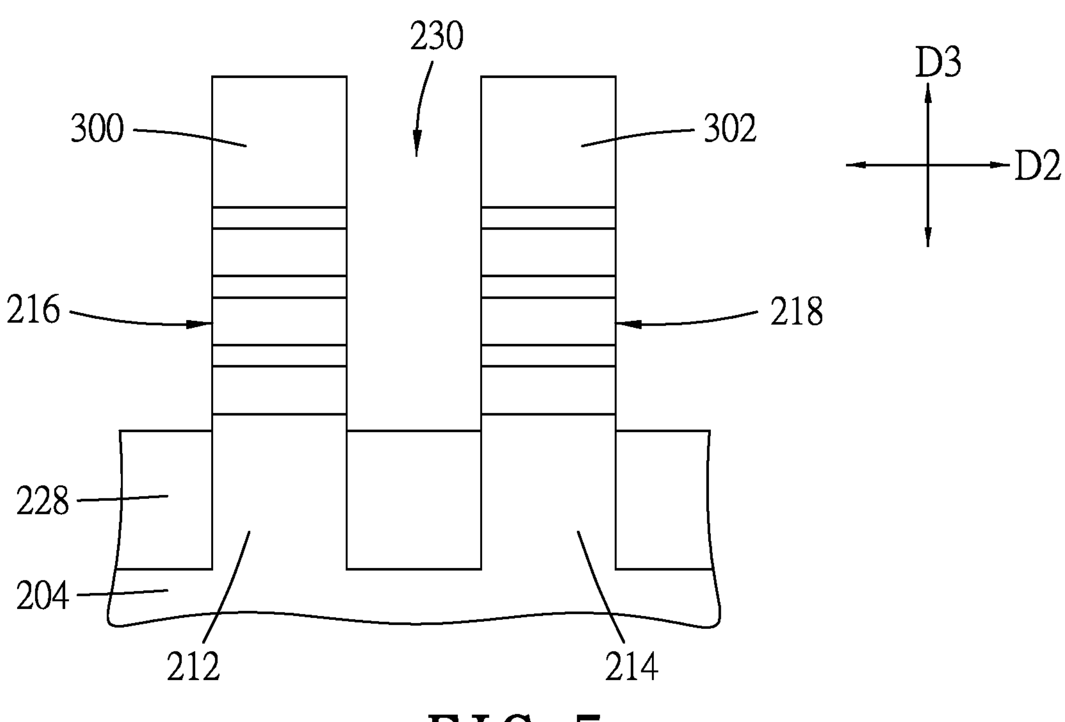

In sub-step 1023, as shown in FIG. 5, an isolation structure 228 (may also be referred to as shallow trench isolation (STI) structure) is formed over the substrate 204 and around the first and second fins 212, 214. FIG. 5 shows a structure formed subsequent to FIG. 4 in accordance with some embodiments. In some embodiments, the isolation structure 228 may be made of an oxide-base material (e.g., silicon oxide, etc.), a nitride-based material (e.g., silicon nitride, etc.), other suitable materials, or any combination thereof. In some embodiments, the isolation structure 228 may be formed by depositing a material for forming the isolation structure 228 over the structure shown in FIG. 4 using CVD, ALD, physical vapor deposition (PVD), or other suitable techniques, followed by removing excess portions of the deposited material.

Figure 6:
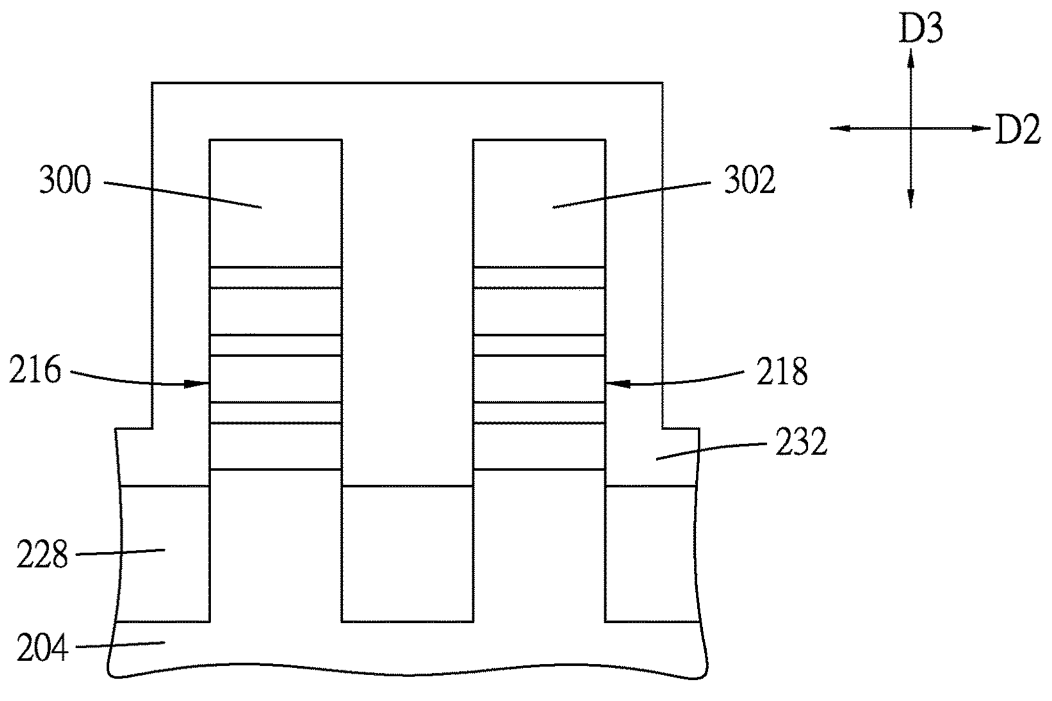

In sub-step 1024, referring to FIG. 6, a dielectric wall material 232 is formed over the structure shown in FIG. 5 (i.e., the isolation structure 228, the first and second stacked structures 216, 218, and the first and second hardmasks 300, 302) to fill a space 230 between the first and second stacked structures 216, 218 (see FIG. 5). In some embodiments, the dielectric wall material 232 may be made of a suitable low k material (from the examples described above), or other suitable materials, and may be made by CVD, ALD, PVD, molecular beam deposition (MBD), or other suitable techniques.

Figure 7:
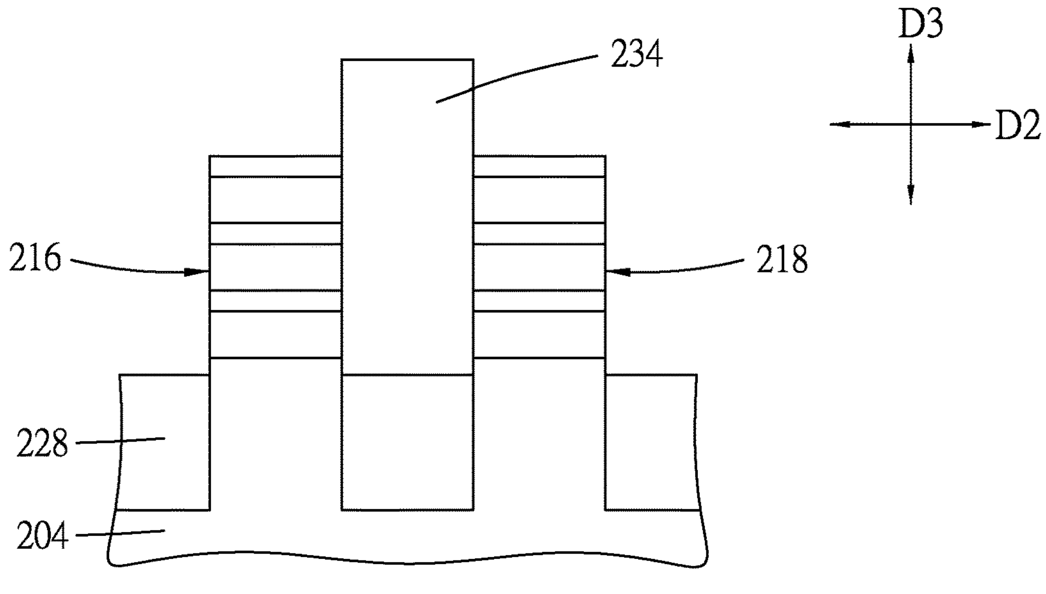

In sub-step 1025, referring to FIG. 7, portions of the dielectric wall material 232 shown in FIG. 6 are removed (e.g., by wet chemical etching, etc.), leaving the dielectric wall material 232 in the space 230 (see FIG. 5) which is referred to as a separating wall 234 that isolates the first and second stacked structures 216, 218.

Figure 8:
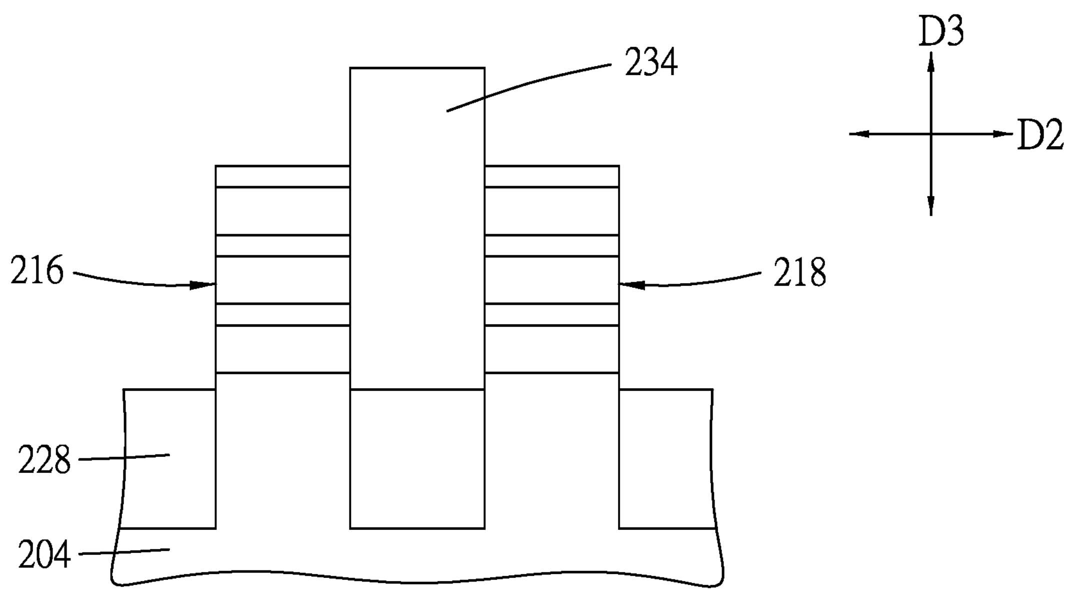
Figure 9:
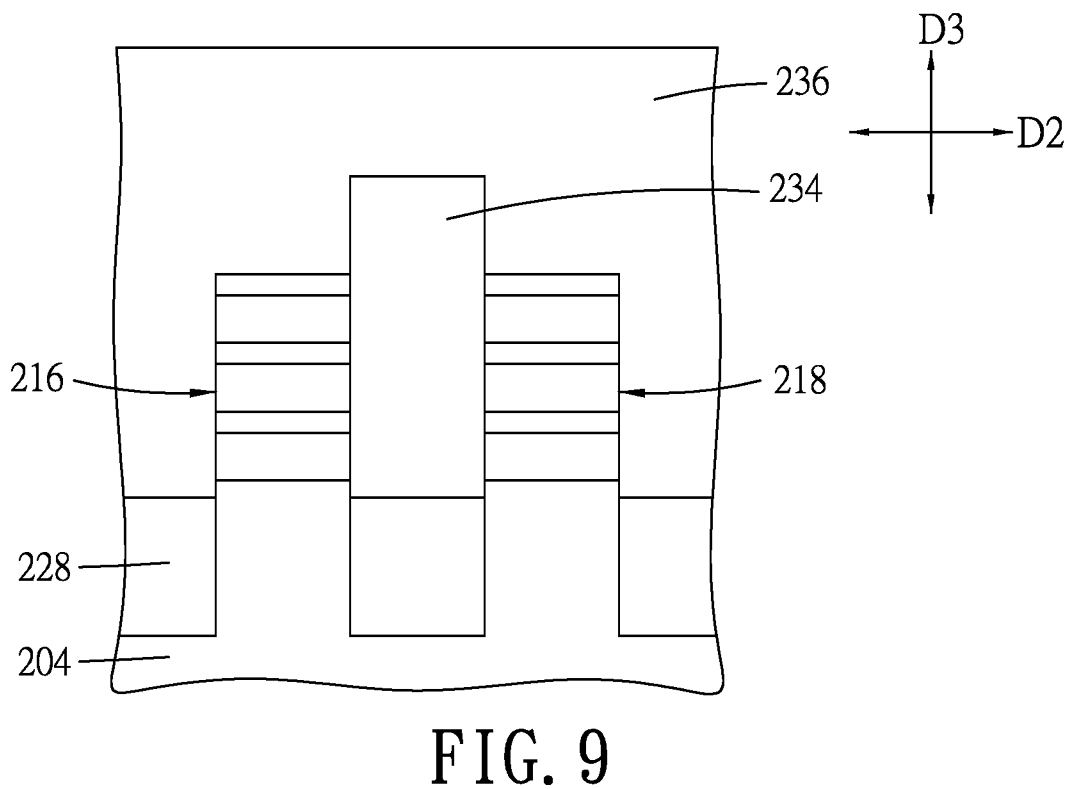

In sub-step 1026, referring to FIGS. 8 and 9 which are schematic sectional views respectively illustrating structures subsequent to the structures taken from lines L1-L1' and L2-L2' of FIG. 3, a dummy gate structure 236 is formed over the isolation structure 228, the first and second stacked structures 216, 218, and the separating wall 234, and is elongated along line L2-L2' shown in FIG. 3. It should be noted that although one dummy gate structure 236 is schematically shown in FIG. 9 for elucidation, there may be a plurality of dummy gate structures that are spaced apart from each other along the first direction (D1) (see FIG. 3) in practical application. In some embodiments, the dummy gate structure 236 may include, although it is not shown in FIG. 9, a dummy dielectric layer (which may be made of silicon oxide, etc. and which is elongated in the second direction (D2) and formed along a contour of the structure obtained in FIG. 7), a dummy gate (which may be made of polysilicon, etc. and which is disposed on the dummy dielectric layer opposite to the substrate 204), and a hard mask layer (which may be made of a suitable low k or high k material (from the examples described above, which is disposed on the dummy gate opposite to the dummy dielectric layer).

Figure 10:
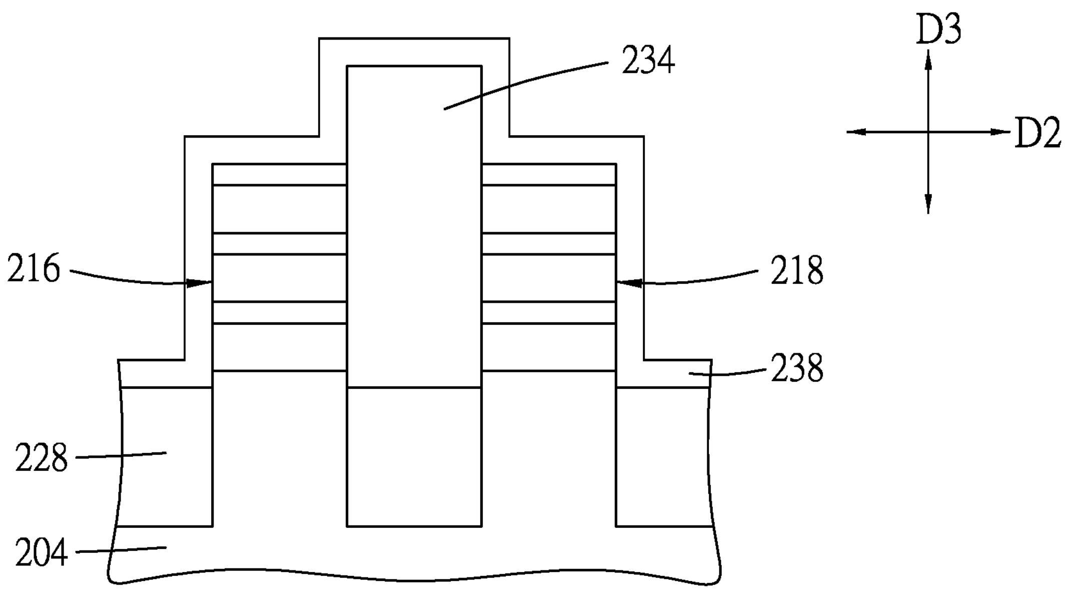
Figure 11:
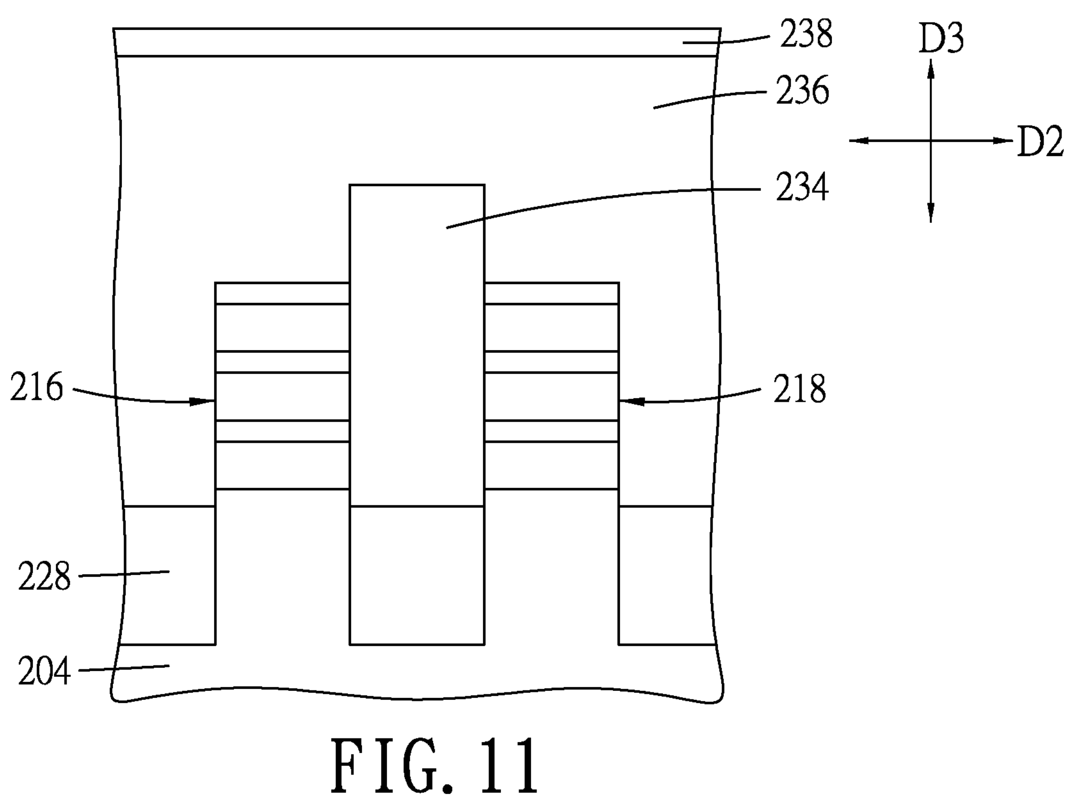

In sub-step 1027, referring to FIGS. 10 and 11 which are schematic sectional views respectively illustrating structures subsequent to FIGS. 8 and 9, a spacer feature 238 is formed over the isolation structure 228, the first and second stacked structures 216, 218, the separating wall 234, and the dummy gate structure 236 by CVD, ALD, PVD, or other suitable techniques. In some embodiments, the spacer feature 238 may be made of a suitable low k material (from the examples described above), or other suitable materials.

In sub-step 1028, referring to FIGS. 12 and 13 which are schematic sectional views respectively illustrating structures subsequent to FIGS. 10 and 11, portions of the spacer feature 238 (see FIGS. 10 and 11) are removed using, for example, a suitable etching process (such as a wet etching process, a dry etching process, other suitable processes, or combinations thereof) and the spacer feature 238 is formed into a plurality of pairs of fin sidewalls 240 (the fin sidewalls 240 in each pair are formed at two opposite sides of an assembly of the first and second stacked structures 216, 218 and the separating wall 234 shown in FIG. 10 and are opposite to each other in the second direction (D2)) and two gate spacers 248 (see FIG. 16) (which are formed at two opposite sides of the dummy gate structure 236 and are opposite to each other in the first direction (D1)). Afterwards, portions of the first and second stacked structures 216, 218 and portions of the first and second fins 212, 214, which are exposed from the dummy gate structure 236, the fin sidewalls 240 and the gate spacers 248, are removed using a suitable etching process (such as the examples described above) to form a pair of first recesses 242 (one of which is shown in FIG. 12) and a pair of second recesses 244 (one of which is shown in FIG. 12). The first recesses 242 are located at two opposite sides of the dummy gate structure 236 and are opposite to each other in the first direction (D1) (see FIG. 16). Similarly, the second recesses 244 are located at the two opposite sides of the dummy gate structure 236 and are opposite to each other in the first direction (D1). Each of the first recesses 242 and a corresponding one of the second recesses 244 are spaced apart from each other in the second direction (D2) by the separating wall 234. Then, two end portions of each of the first sacrificial features 220 of the first stacked structure 216 and the second sacrificial features 224 of the second stacked structure 218, which are opposite to each other in the first direction (D1), are etched back to form two lateral recesses (not shown), a dielectric material for forming inner spacers 250 (see FIG. 16) is formed using CVD, ALD, or other suitable techniques so as fill the lateral recesses, and extra portions of the dielectric material are removed using a suitable etching process so as to obtain the inner spacers 250 in the lateral recesses. The inner spacers 250 are each made of a suitable low k material (from the examples described above) or other suitable materials. The semiconductor feature 202 is thus obtained. After step 102, the separating wall 234 includes a first wall portion 234A covered by the dummy gate structure 236, and two second wall portions 234B exposed from and at two opposite sides of the dummy gate structure 236. In some embodiments, after step 102, the remaining first channel features 222 may serve as channels of a first device 201 shown in FIG. 48, and the remaining second channel features 226 may serve as channels of a second device 203 shown in FIG. 49. Other suitable processes for forming the semiconductor feature 202 are within the contemplated scope of this disclosure.

Figure 17:
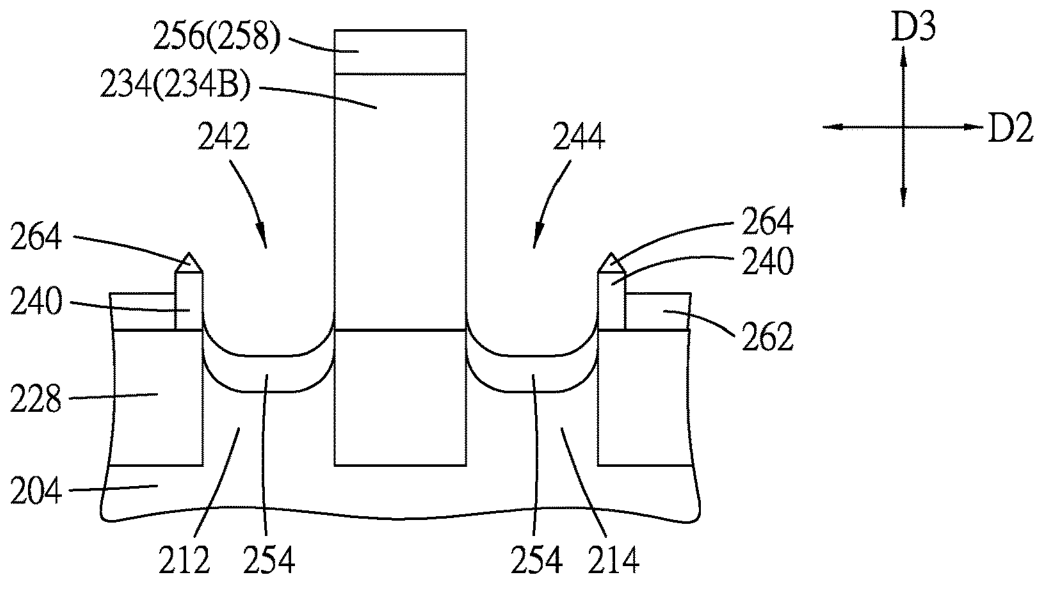
Figure 18:
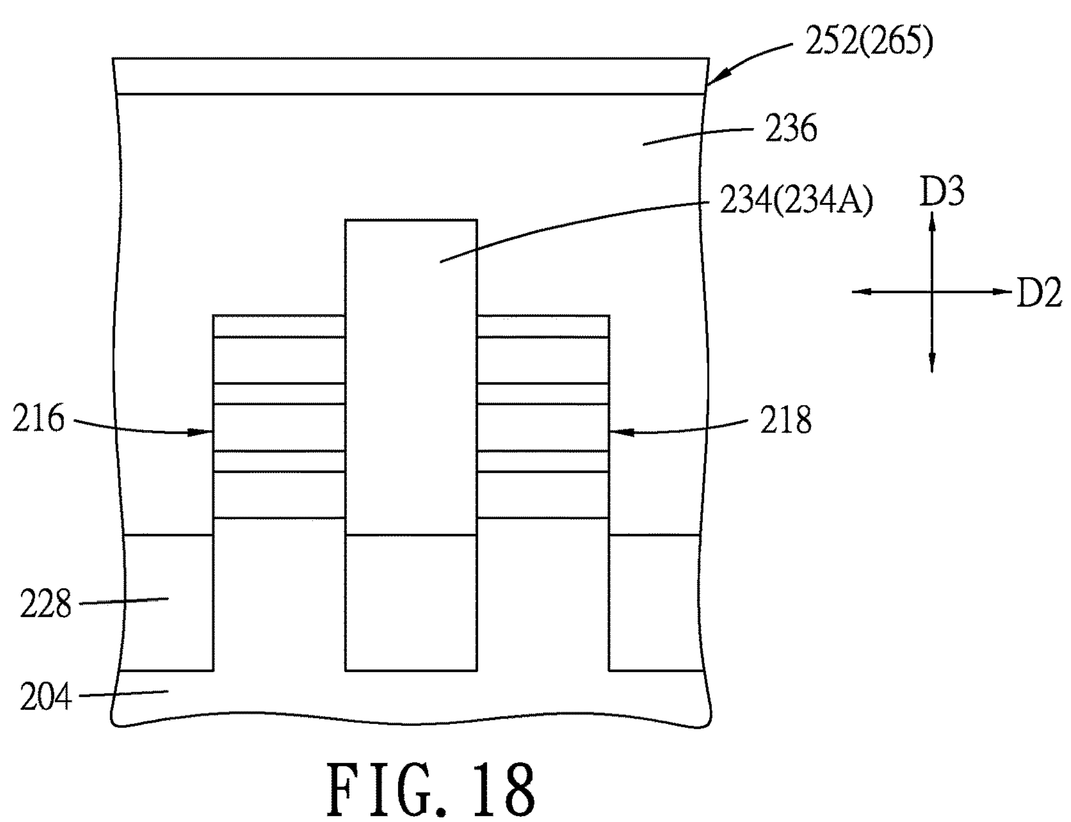
Figure 19:
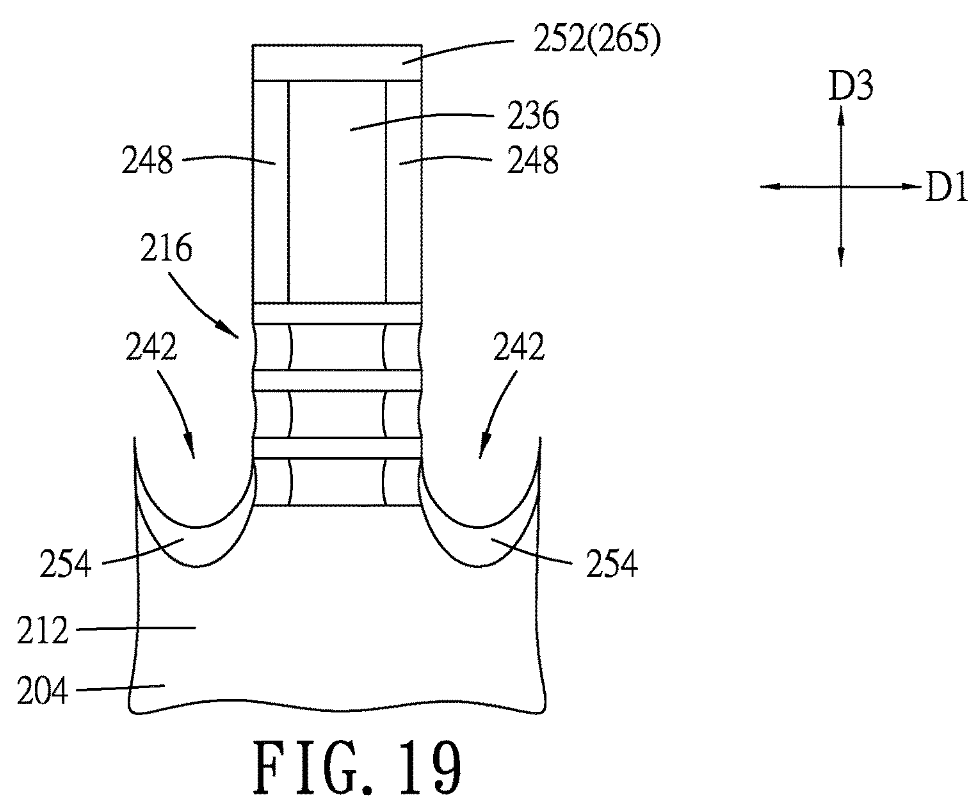

Referring to FIG. 1, in a step 104 of the method 100, a dielectric structure is formed. FIGS. 17 to 19 respectively illustrate different cross-sectional views of the dielectric structure 252 in accordance with some embodiments. In some embodiments, step 104 includes sub-steps 1041 to 1043.

Figure 14:
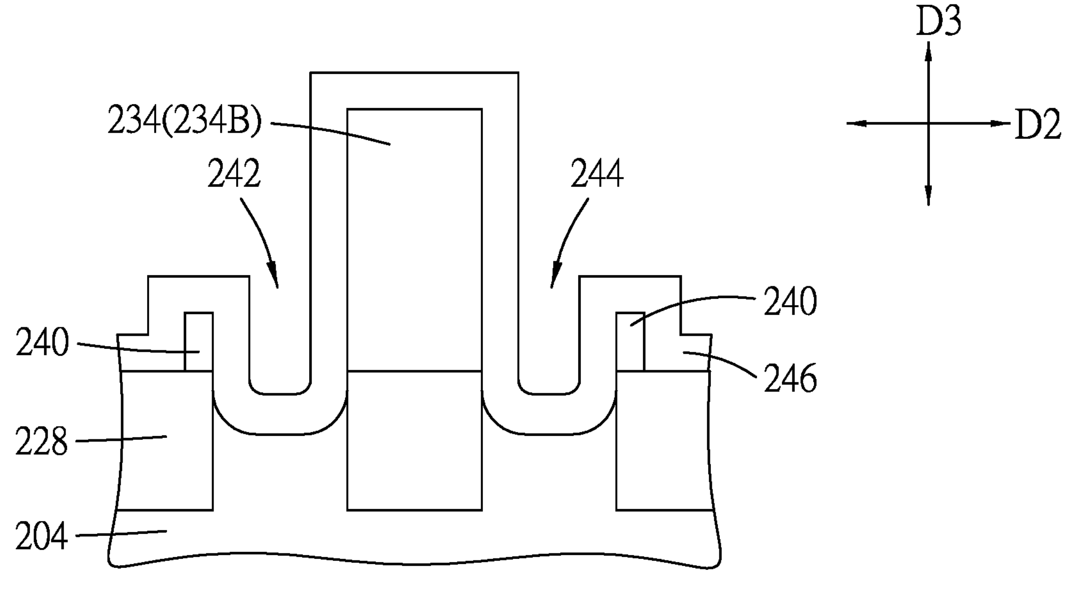
Figure 15:
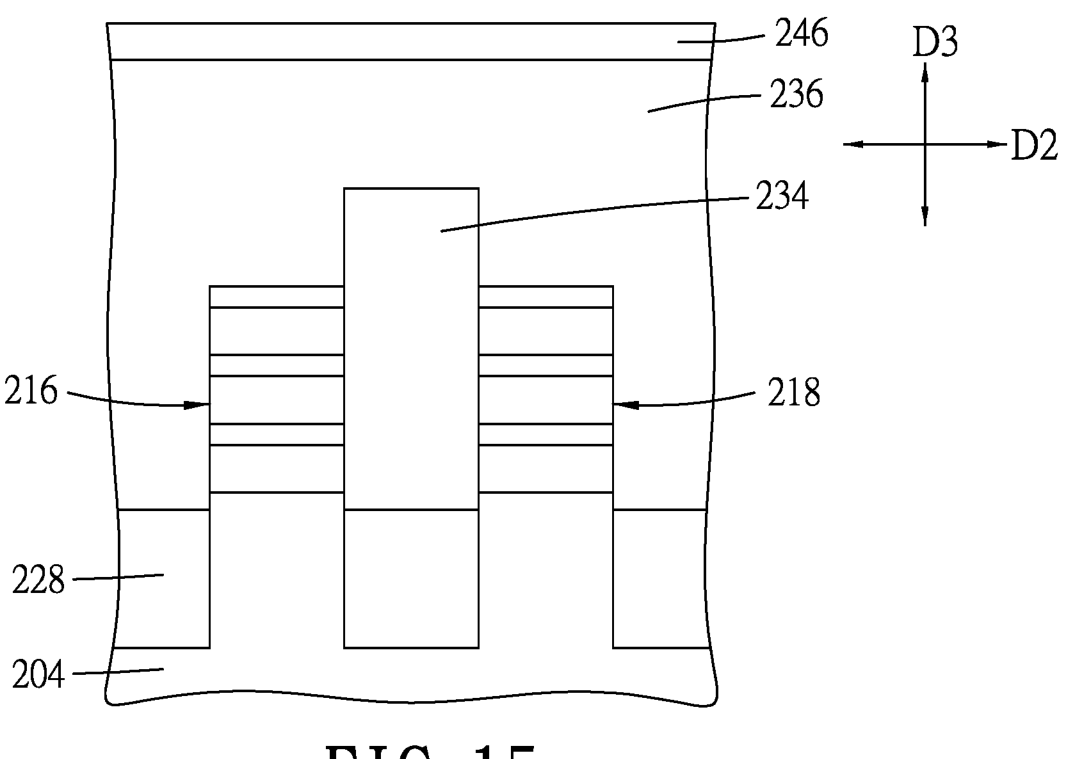
Figure 16:
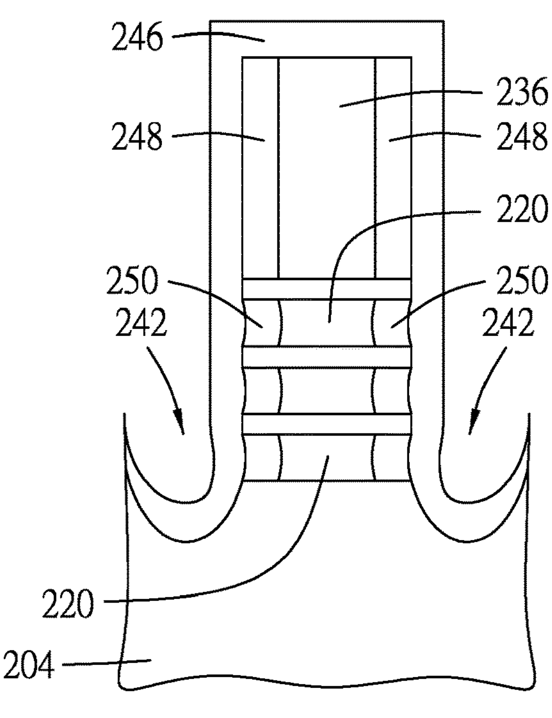
Figure 16:
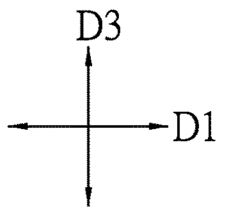

In sub-step 1041, referring to FIGS. 14 to 16, a dielectric layer 246 is formed. FIGS. 14 and 15 are schematic sectional views respectively similar to FIGS. 12 and 13, but illustrating the structure after formation of the dielectric layer 246 in accordance with some embodiments. FIG. 16 is a schematic sectional view illustrating a structure after formation of the dielectric layer 246, which is subsequent to the structure taken from line L3-L3' of FIG. 3 in accordance with some embodiments. In some embodiments, the dielectric layer 246 may be conformally or non-conformally formed over the semiconductor feature 202 (see FIGS. 12 and 13) by CVD, ALD, PVD, or other suitable techniques. In some embodiments, the dielectric layer 246 may be made of a suitable low k material (from examples described above), a suitable high k material (from the examples described above), or other suitable materials. In some embodiments, the dielectric layer 246 may be a single layer or may be composed of multiple sub-layers.

In sub-step 1042, a directional treatment may be applied to the dielectric layer 246 along the third direction (D3), such that horizontal portions of the dielectric layer 246 (e.g., the portions of the dielectric layer 246 on a top surface of the separating wall 234, bottom surfaces of the first and second recesses 242, 244, and so on) are treated and vertical portions of the dielectric layer 246 (e.g., portions of the dielectric layer 246 on side walls of the fin sidewalls 240, the separating wall 234, the gate spacers 248, and the inner spacers 250) are not treated or slightly treated. In some embodiments, the directional treatment may be performed during or after the formation of the dielectric layer 246. In some embodiments, the dielectric layer 246 may be formed in a cyclical manner by repeating sub-steps 1041 and 1042. That is, the dielectric layer 246 may be formed by multiple repetitions of deposition and directional treatment. In some embodiments, the directional treatment may be ion implantation, plasma or radical treatment, or other suitable techniques. In some embodiments, during the directional treatment, nitrogen, carbon, oxygen, other suitable elements, or any combination thereof may be introduced into the horizontal portions of the dielectric layer 246.

In sub-step 1043, referring to FIGS. 17 to 19 which are schematic sectional views respectively illustrating structures subsequent to FIGS. 14 to 16, untreated portions of the dielectric layer 246, which are not treated or slightly treated, are removed while leaving the treated portions of the dielectric layer 246 unetched or slightly etched to thereby obtain the dielectric structure 252. In some embodiments, the untreated portions of the dielectric layer 246 may be removed by hydrogen fluoride (HF) or other suitable etchants. In some embodiments, the dielectric structure 252 includes a plurality of bottom dielectric portions 254 that are respectively formed in the first and second recesses 242, 244 over the first and second fins 212, 214, a top dielectric portion 256 that is formed over the separating wall 234, and a side dielectric portion 262 that is formed over the isolation structure 228. In some embodiments, the dielectric structure 252 further includes a plurality of minor portions 264 that are respectively disposed over the fin sidewalls 240. In some embodiments, the dielectric structure 252 may further include a covering dielectric portion 265 formed over the dummy gate structure 236 and the gate spacers 248. In some embodiments, the top dielectric portion 256 includes two top dielectric segments 258 which are respectively formed on the second wall portions 234B so as to prevent upper portions of first epitaxial structures 266 (formed in step 106) from being merged with upper portions of second epitaxial structures 268 (formed in step 106).

In some embodiments, the dielectric structure 252 includes two of the bottom dielectric portions 254 covering over the second fin 214 (see also FIG. 49) and each of the bottom dielectric portions 254 is disposed to separate a corresponding one of the second epitaxial structures 268 from the second fin 214, so as to electrically isolate lower portions of the second epitaxial structures 268 from lower portions of the first epitaxial structures 266. In some embodiments, the dielectric structure 252 further includes another two of the bottom dielectric portions 254 covering the first fin 212 (see also FIG. 48), and each of the another two of the bottom dielectric portions 254 is disposed to separate a corresponding one of the first epitaxial structures 266 from the first fin 212, so as to further ensure that the second epitaxial structures 268 are electrically isolated from the first epitaxial structures 266. Other suitable processes for forming the dielectric structure 252 are within the contemplated scope of this disclosure.

Figure 26:
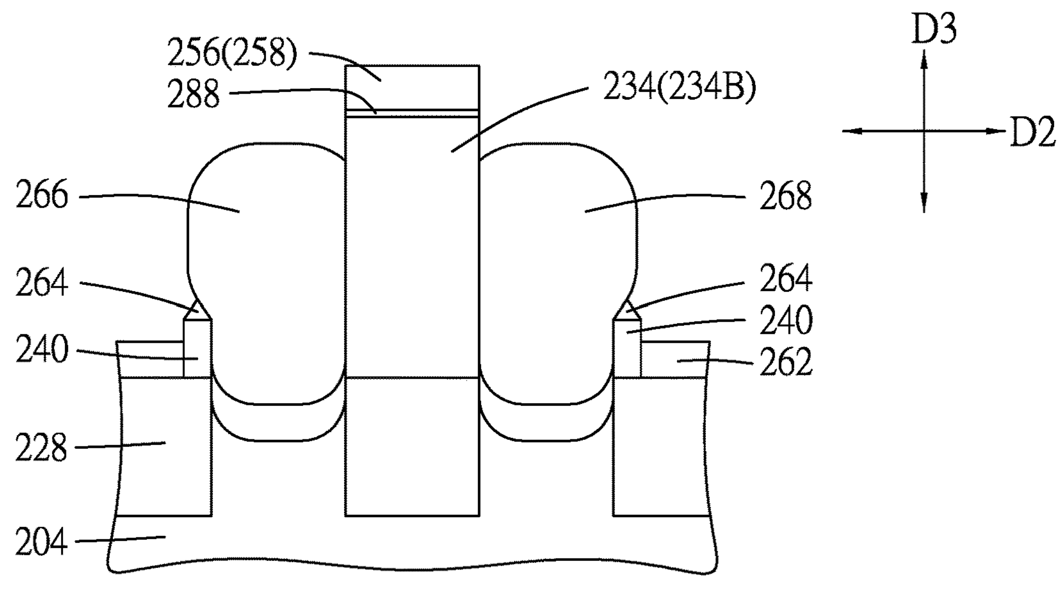
Figure 48:
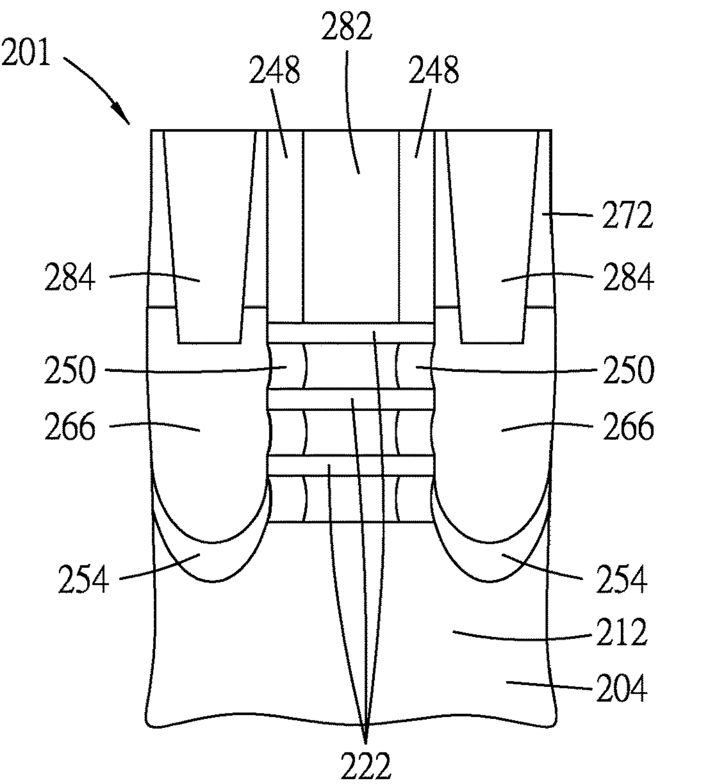
FIGS. 48 and 49 are schematic sectional views of a semiconductor structure in accordance with some embodiments of this disclosure.
Figure 48:
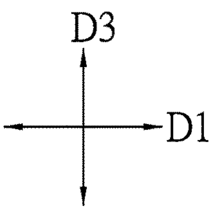
Figure 49:
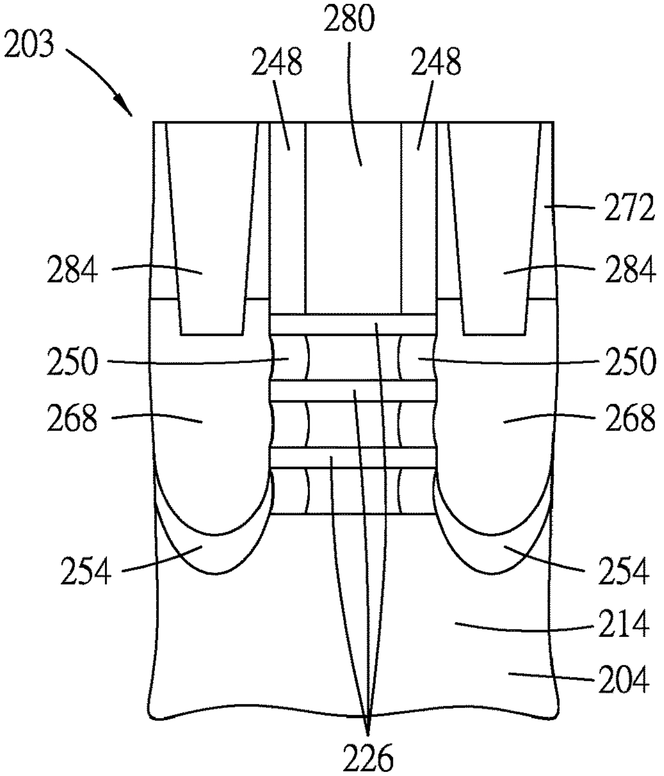
Figure 49:
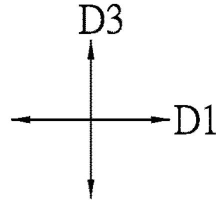

Referring to FIG. 1, in a step 106 of the method 100, a plurality of first and second epitaxial structures are formed. As shown in FIGS. 26, 48 and 49, at least two first epitaxial structures 266 and at least two second epitaxial structures 268 are respectively formed in the first recesses 242 (one of which is shown in FIG. 17) and the second recesses 244 (one of which is shown in FIG. 17). In some embodiments, step 106 may include sub-steps 1061 to 1066. In some embodiments, the first epitaxial structures 266 may serve as source/drain structures of the first device 201 shown in FIG. 48, and the second epitaxial structures 268 may serve as source/drain structures of the second device 203 shown in FIG. 49. The source/drain structures may refer to a source or a drain, individually or collectively dependent upon the context.

Figure 20:
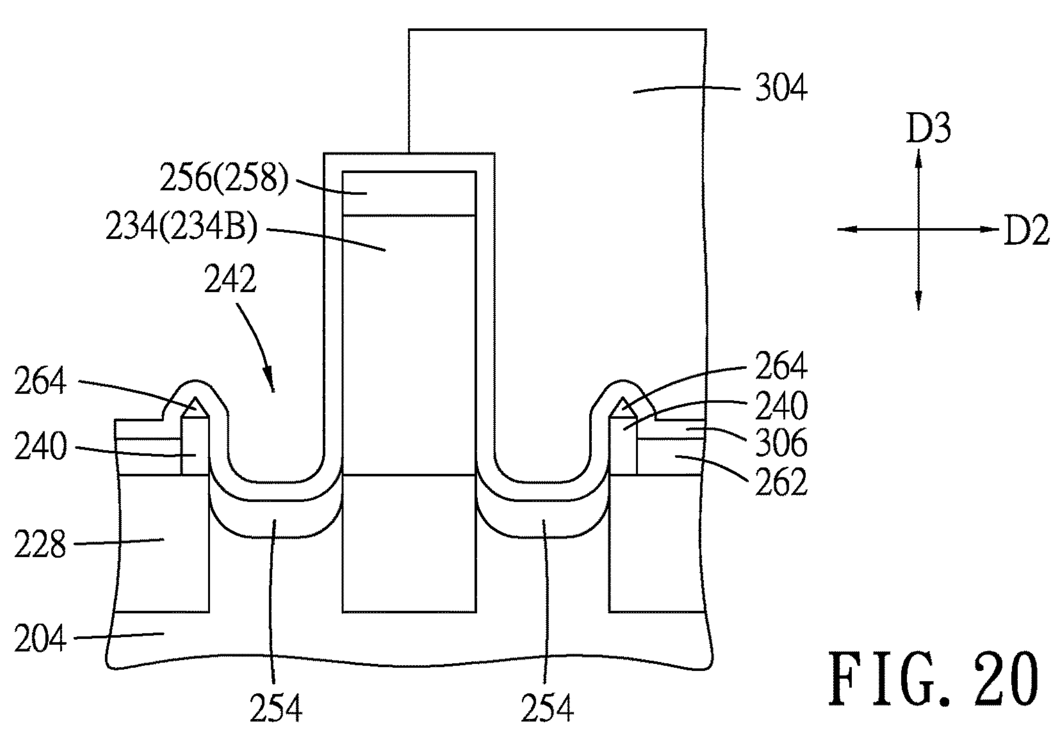
Figure 21:
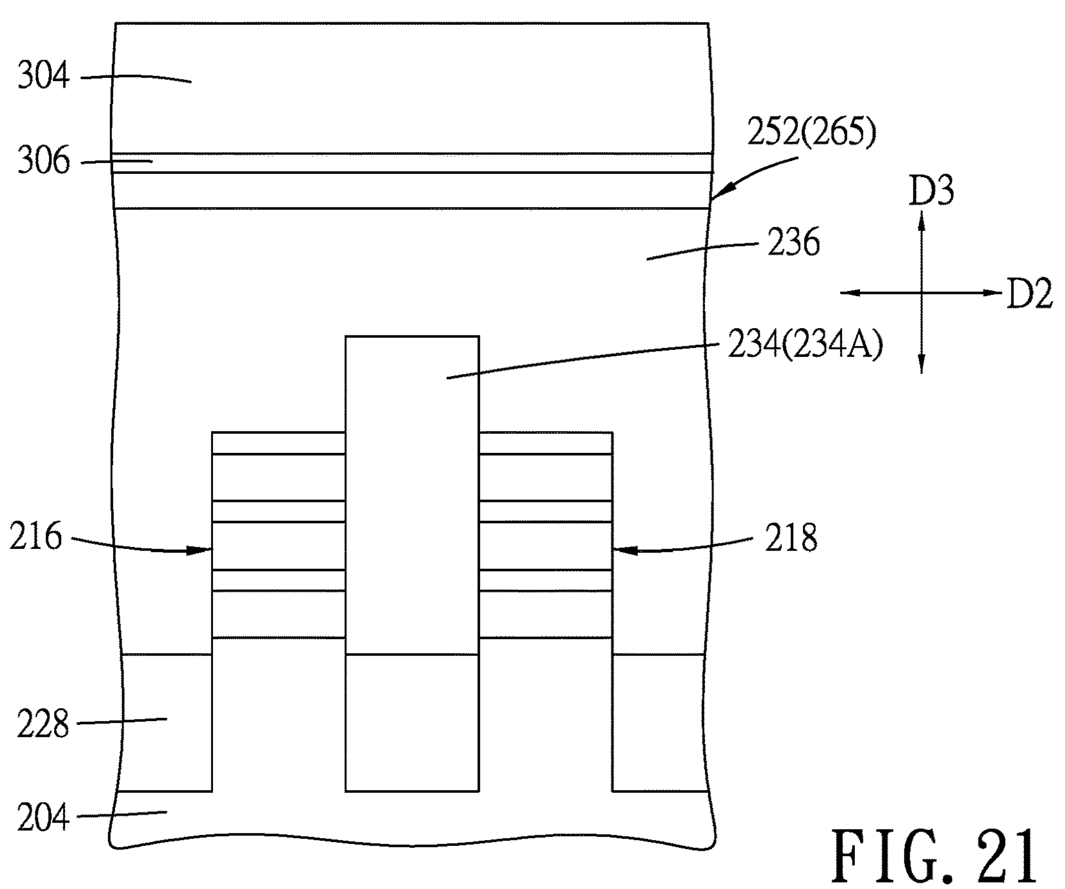

In sub-step 1061, referring to FIGS. 20 and 21 which are schematic sectional views respectively illustrating structures subsequent to FIGS. 17 to 18, a first mask layer 306 is formed over the structures shown in FIGS. 17 and 18, and a first mask feature 304 is formed to partially cover the first mask layer 306. The first mask layer 306 may include a dielectric material (such as silicon oxide, silicon nitride, silicon oxynitride, aluminum oxide, and so on), a bottom anti-reflective coating (BARC), or a combination thereof. In some embodiments, the first mask feature 304 is a patterned photoresist and may be formed by spin coating a photoresist over the first mask layer 306, and patterning the photoresist using a photomask or without a mask (e.g., ion-beam writing) to obtain the patterned photoresist.

In sub-step 1062, portions of the first mask layer 306 exposed from the first mask feature 304 is removed using a suitable etching process to expose the first recesses 242 (one of which is shown in FIG. 20), and then the first mask feature 304 is removed using an ashing process or other suitable techniques.

Figure 22:
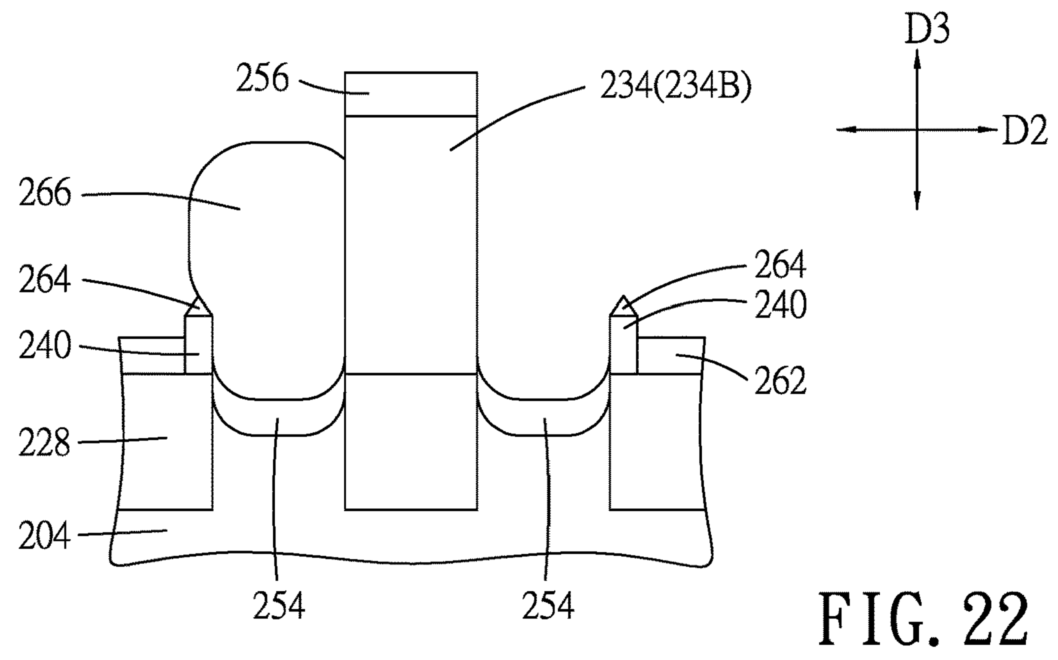
Figure 23:
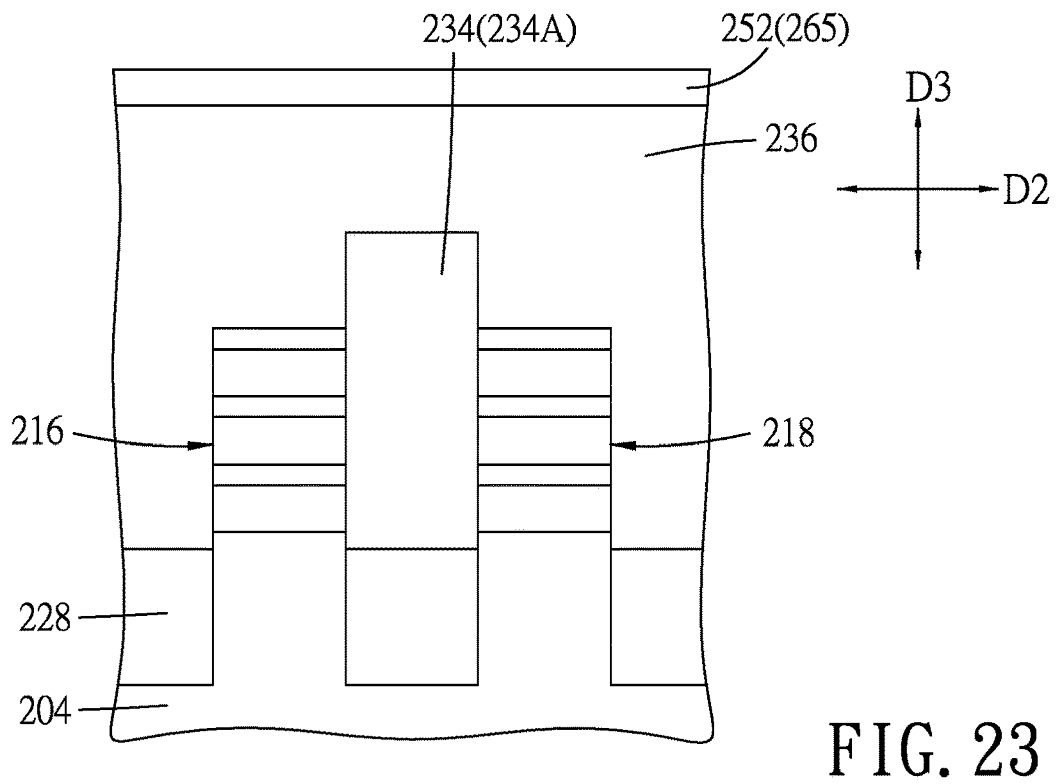

In sub-step 1063, referring to FIGS. 22 and 23, the first epitaxial structures 266 (one of which is shown in FIG. 22) are respectively formed in the first recesses 242 (one of which is shown in FIG. 20) and then the remaining first mask layer 306 is removed using a suitable etching process (such as the examples described above). In some embodiments, the first epitaxial structures 266 may be made of Si, SiGe, or other suitable materials, and may be doped with a suitable dopant (e.g., n-type impurities, p-type impurities, etc.), and may be made by epitaxial growth which may involve a deposition process such as CVD, ALD, or other suitable techniques, but is not limited thereto. In some other embodiments, both the first mask feature 304 and the first mask layer 306 may be removed after the formation of the first epitaxial structures 266.

Figure 24:
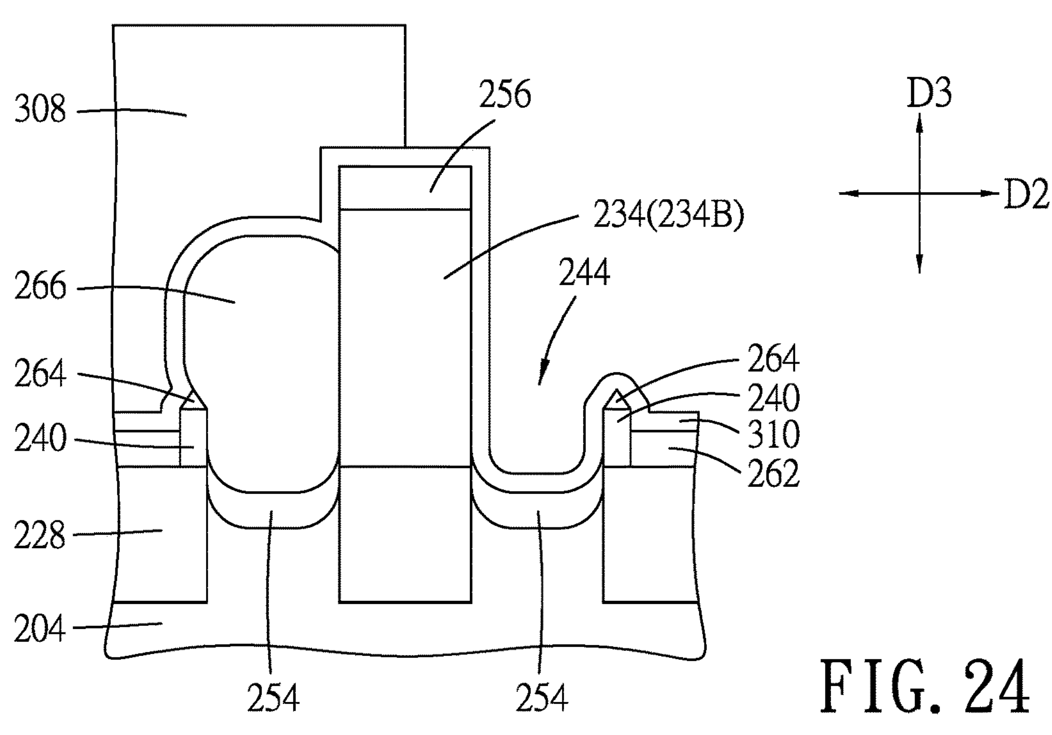
Figure 25:
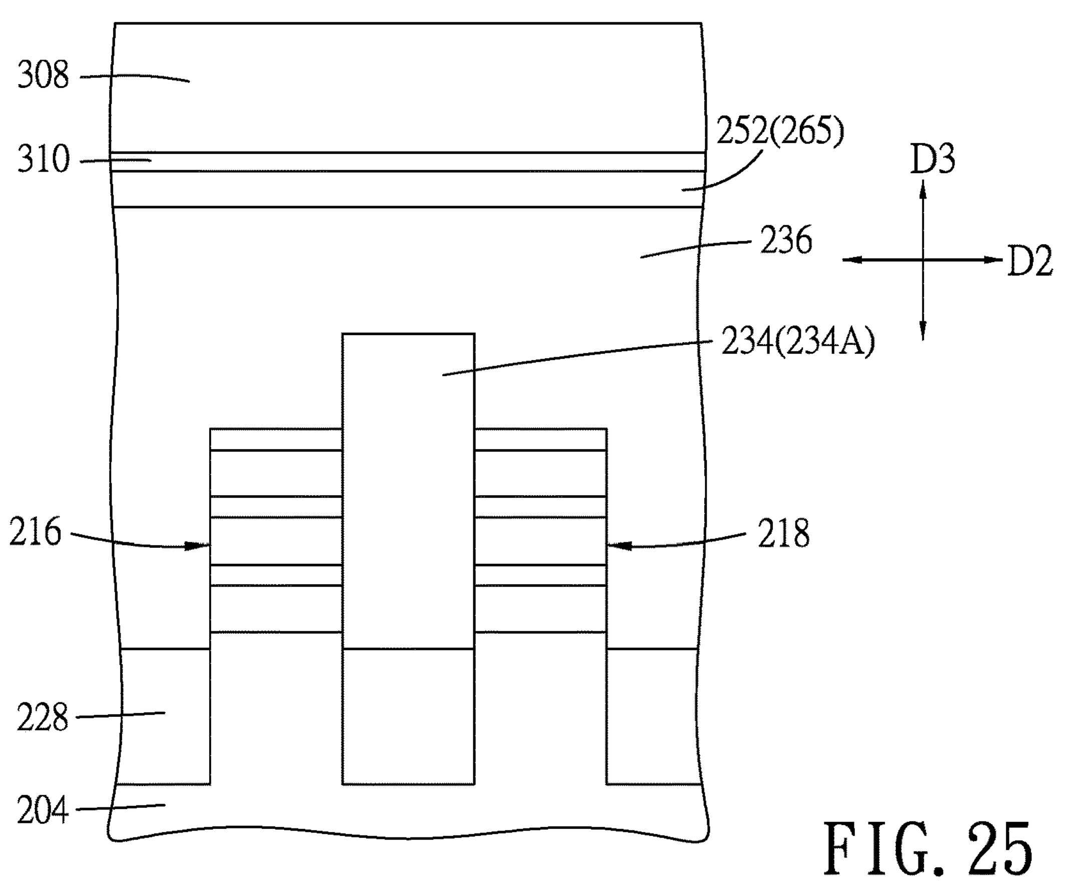

In sub-step 1064, referring to FIGS. 24 to 25, a second mask feature 308 and a second mask layer 310 are formed over the structure after sub-step 1063. The second mask feature 308 and the second mask layer 310 are respectively similar to the first mask feature 304 and the first mask layer 306 in sub-step 1061 in terms of materials but the second mask feature 308, which covers the first epitaxial structures 266, is different from that of the first mask feature 304 in position.

In sub-step 1065, portions of the second mask layer 310 exposed from the second mask feature 308 are removed using a suitable etching process (such as the examples described above) to expose the second recesses 244 (one of which is shown), and then the second mask feature 308 is removed using an ashing process or other suitable techniques.

Figure 27:
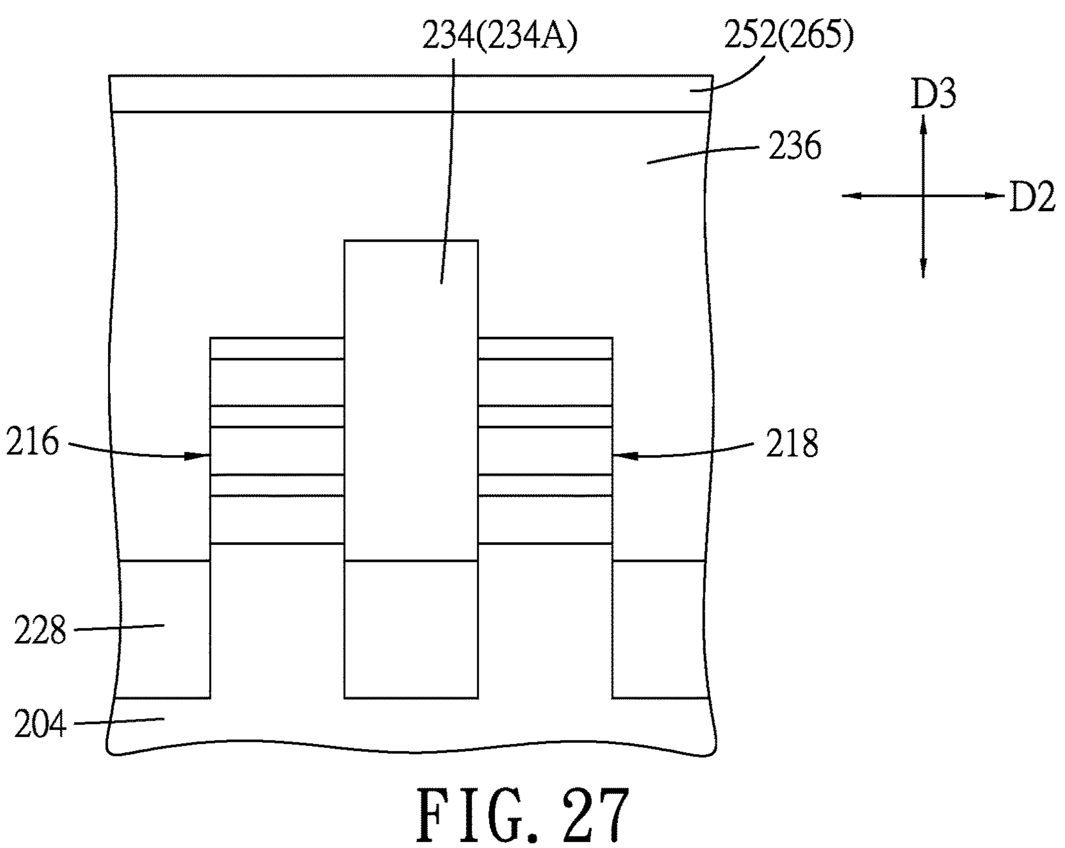

In sub-step 1066, referring to FIGS. 26, 27 and 49, the second epitaxial structures 268 are respectively formed in the second recesses 242 (one of which is shown in FIG. 24) and then the remaining second mask layer 310 is removed using a suitable etching process (such as the examples described above). In some other embodiments, both the second mask feature 308 and the second mask layer 310 may be removed after the formation of the second epitaxial structures 268. The possible materials and methods for forming the second epitaxial structures 268 are similar to those for the first epitaxial structures 266. In some embodiments, the first epitaxial structures 266 may have a conductivity type different from that of the second epitaxial structures 268. In some other embodiments, the first epitaxial structures 266 may have a conductivity type the same as that of the second epitaxial structures 268. Other suitable processes for forming the first and second epitaxial structures 266, 268 are within the contemplated scope of this disclosure.

Figure 28:
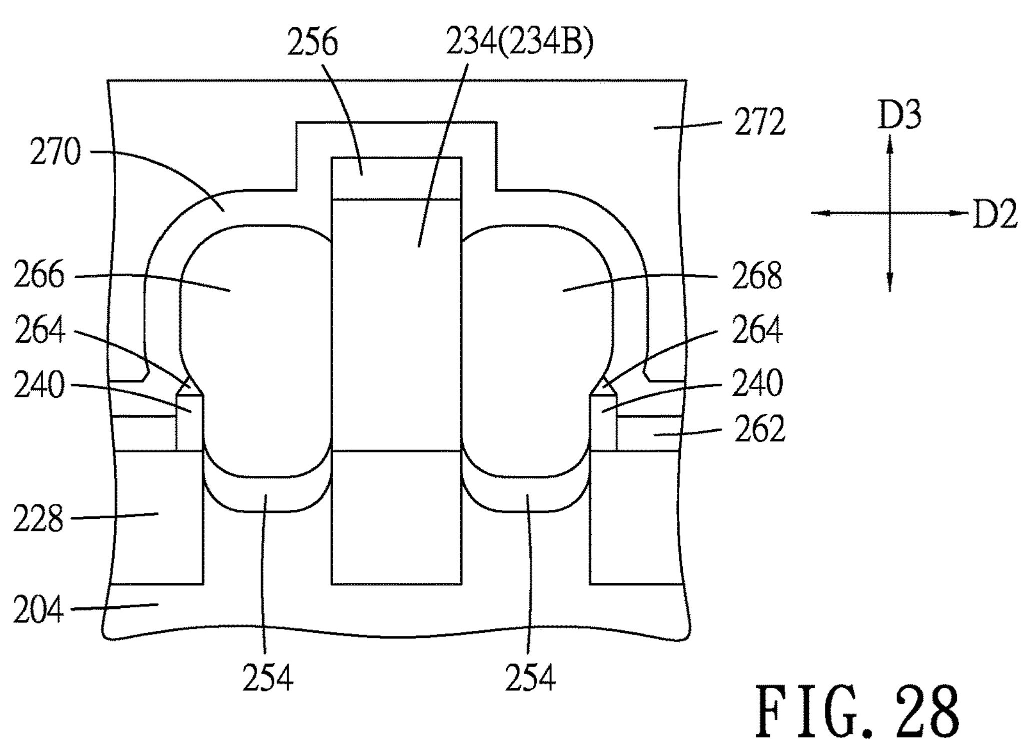
Figure 29:
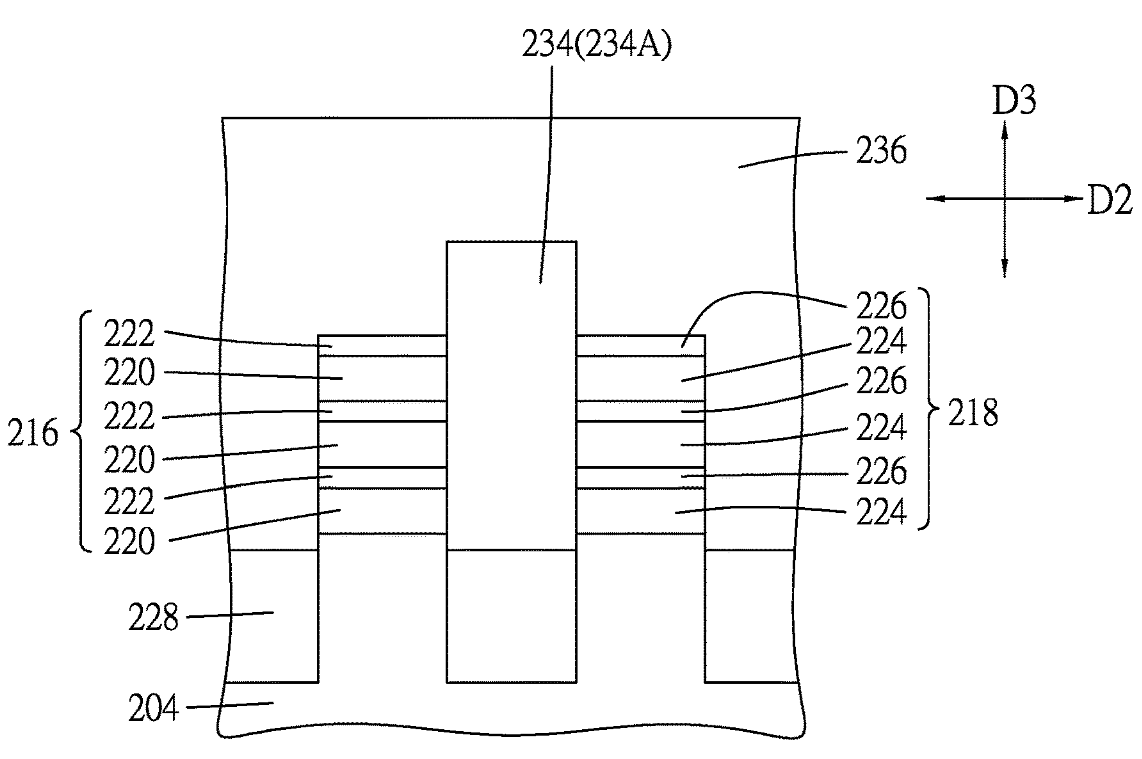

Referring to FIG. 1, in a step 108 of the method 100, a contact etching stop layer and an interlayer dielectric layer are formed. Referring to FIGS. 28 and 29 which are schematic sectional views respectively illustrating structures subsequent to FIGS. 26 and 27, the contact etching stop layer 270 is formed to cover the first and second epitaxial structures 266, 268, followed by forming the interlayer dielectric layer 272 over the contact etching stop layer 270. In some embodiments, the contact etching stop layer 270 may be made of a suitable low k material (from the examples described above), a suitable high k material (from the examples described above), a combination thereof, or other suitable materials, and may be made by ALD, CVD, PVD, or other suitable techniques. In some embodiments, the interlayer dielectric layer 272 may be made of a suitable low k material (from the examples described above), boron carbon nitride (BCxNy), hydrogenated silicon oxycarbide (SiOxCyHz), phosphosilicate glass (PSG), amorphous fluorinated carbon, borophosphosilicate glass (BPSG), spin-on glass (SOG), fluorosilicate glass (FSG), carbon-doped silicon oxide (e.g., SiCOH), xerogel, aerogel, parylene, divinylsiloxane-bis-benzocyclobutene-based (BCB-based) dielectric material, bis-benzocyclobutenes, polyimide, non-porous or porous dielectric materials, any combination thereof, or other suitable materials, and may be made by ALD, CVD, PVD, or other suitable techniques, followed by a planarization process such as CMP or other suitable techniques to remove the covering dielectric portion 265 shown in FIG. 27 and the hard mask layer (not shown) of the dummy gate structure 236, which exposes the dummy gate (not shown) of the dummy gate structure 236. Other suitable processes for forming the contact etching stop layer 270 and the interlayer dielectric layer 272 are within the contemplated scope of this disclosure.

Figure 35:
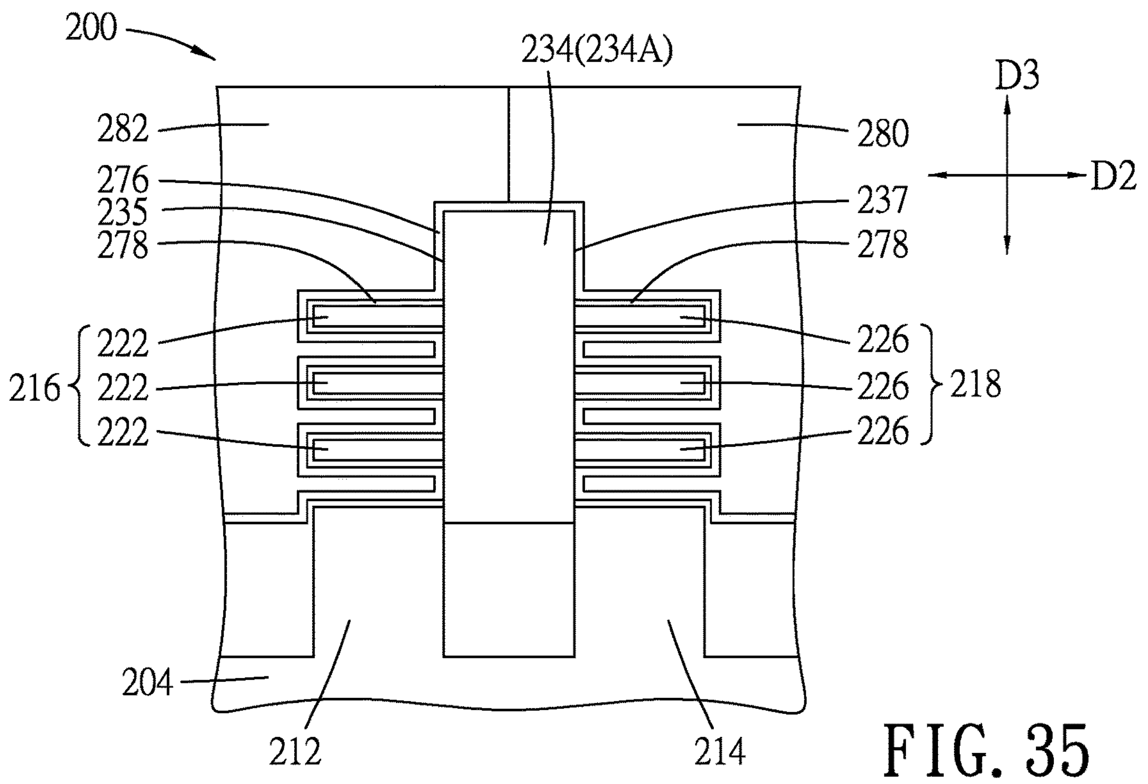

Referring to FIG. 1, in a step 110 of the method 100, a gate replacement process is performed to replace the remaining dummy gate structure with a first gate structure and a second gate structure. FIG. 35 illustrates the first gate structure 282 and the second gate structure 280 in accordance with some embodiments. In some embodiments, step 110 may include sub-steps 1101 to 1105.

Figure 30:
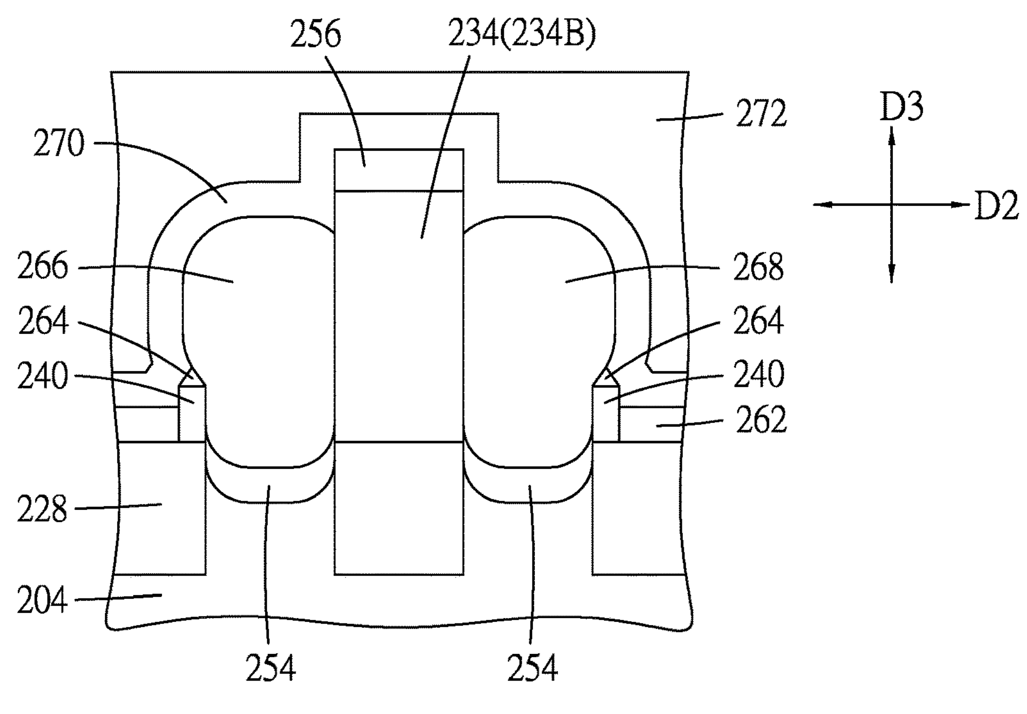
Figure 31:
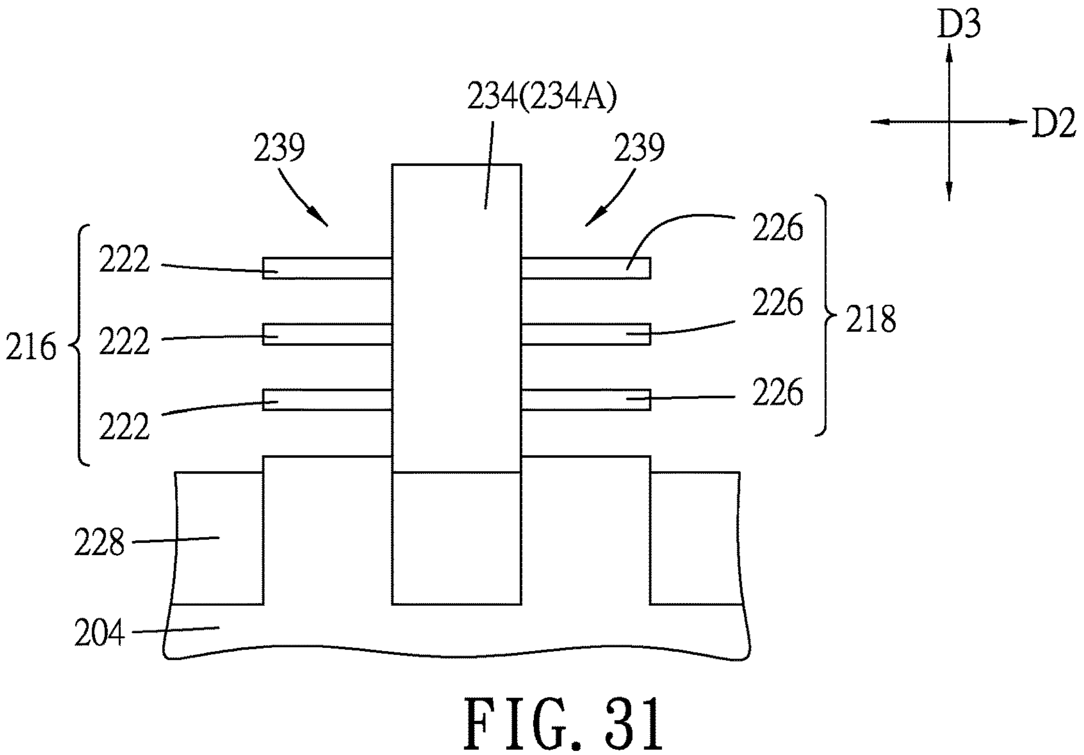

Referring to FIGS. 30 and 31 which are schematic sectional views respectively illustrating structures subsequent to FIGS. 28 to 29, in sub-step 1101, the dummy gate structure 236, the first sacrificial features 220 of the first stacked structure 216, and the second sacrificial features 224 of the second stacked structure 218 shown in FIG. 29 are removed using a suitable etching process (such as the examples described above) to form a plurality of cavities 239 (two of which are shown in FIG. 31).

Figure 32:
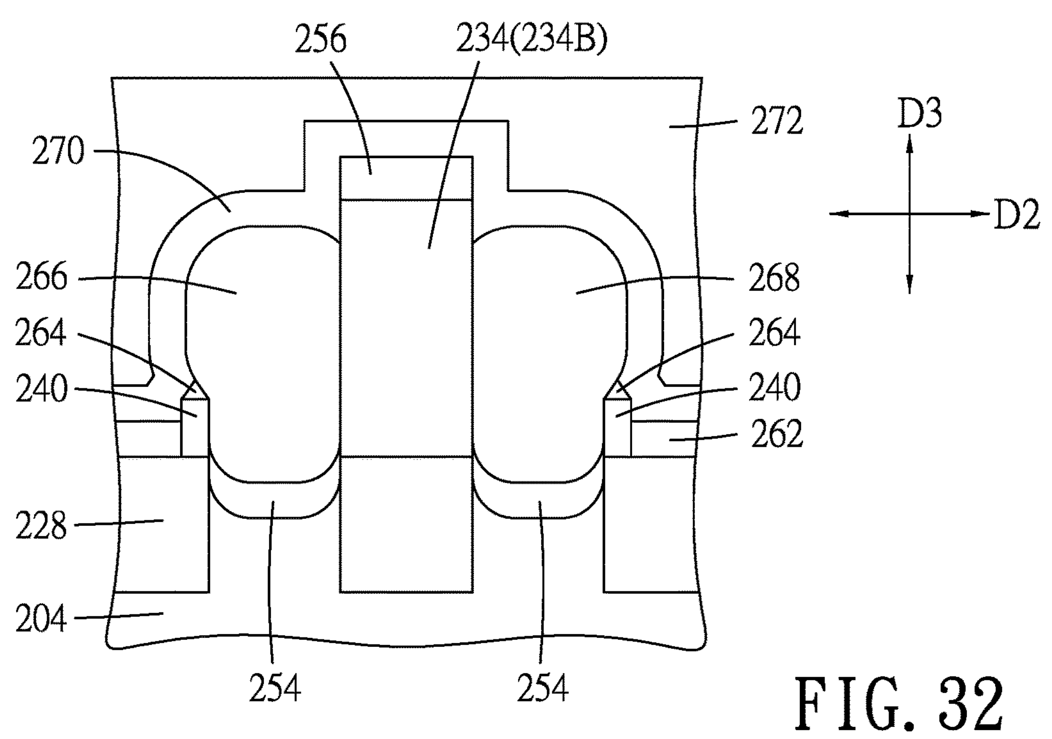
Figure 33:
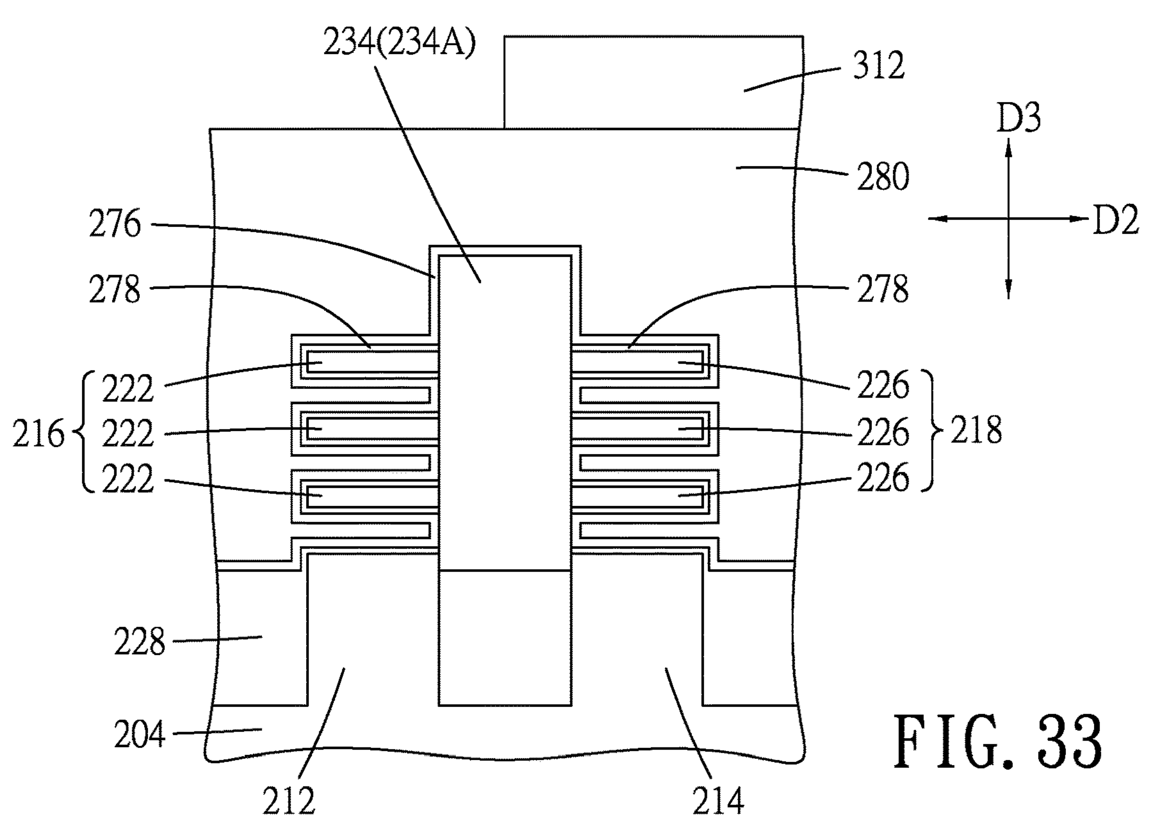

In sub-step 1102, referring to FIGS. 32 and 33 which are schematic sectional views respectively illustrating structures subsequent to FIGS. 30 to 31, a plurality of interfacial layers 278 are respectively formed around the first and second channel features 222, 226, and a gate dielectric layer 276 is formed around the interfacial layers 278 and over the first wall portion 234A of the separating wall 234, and the first and second fins 212, 214 and the isolation structures 228 that are exposed from the cavities 239 shown in FIG. 31. In some embodiments, the interfacial layers 278 may be made of a suitable low k material (from the examples described above), and may be made by thermal oxidation or other suitable techniques. In some embodiments, the gate dielectric layer 276 may be made of a suitable high k material (from the examples described above), and may be made by ALD, CVD, or other suitable techniques.

In sub-step 1103, a second gate structure 280 is formed over the gate dielectric layer 276 to fill the cavities 239 using CVD, ALD or other suitable techniques, followed by a planarization process such as CMP or other suitable techniques to expose the interlayer dielectric layer 272. In some embodiments, the second gate structure 280 may be made of conductive metal (e.g., aluminum (Al), copper (Cu), tungsten (W), cobalt (Co), ruthenium (Ru), titanium (Ti), tantalum (Ta), molybdenum (Mo), nickel (Ni), platinum (Pt), etc.), metal-containing nitride (e.g., titanium nitride (TiN), tantalum nitride (TaN), etc.), metal-containing silicide (e.g., nickel silicide (NiSi), etc.), metal-containing carbide (e.g., tantalum carbide (TaC), etc.), or other suitable materials.

In sub-step 1104, a third mask feature 312 is formed over the second gate structure 280 to partially cover and partially expose the second gate structure 280. In some embodiments, the third mask feature 312 is formed to mainly cover portions of the second gate structure 280 that surrounds the second channel features 226. In some embodiments, the third mask feature 312 may be made of a suitable low k or high k material (from the examples described above).

Figure 34:
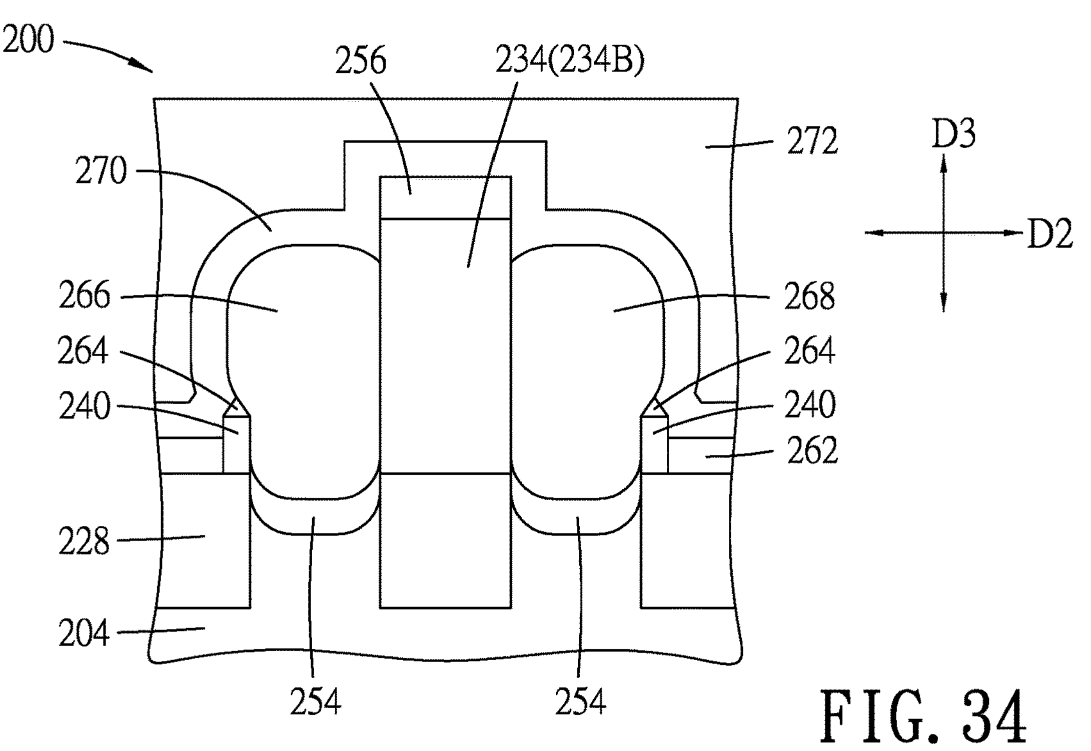

In sub-step 1105, referring to FIGS. 34 and 35 which are schematic sectional views respectively illustrating structures subsequent to FIGS. 32 to 33, an exposed portion of the second gate structure 280 may be removed using a suitable etching process (such as the examples described above), and a first gate structure 282 is formed in place of the exposed portion of the second gate structure 280 by depositing the second gate structure 282 using CVD, ALD or other suitable techniques, which is then followed by a planarization process such as CMP or other suitable techniques to expose the remaining portion of the second gate structure 280. Possible materials for the first gate structure 282 are similar to those for the second gate structure 280. In some embodiments, the first gate structure 282 may serve as a gate electrode of the first device 201 shown in FIGS. 47 and 48, and the second gate structure 280 may serve as a gate electrode of the second device 203 shown in FIGS. 47 and 49. In some embodiments, the material of the first gate structure 282 is different from that of the second gate structure 280 so as to permit the first and second devices 201, 203 to have different threshold voltages. In some other embodiments, the materials of the first and second gate structures 282, 280 may be the same. The semiconductor structure 200 is thus obtained. Other suitable processes for forming the first gate structure 282 and the second gate structure 280 are within the contemplated scope of this disclosure.

Figure 36:
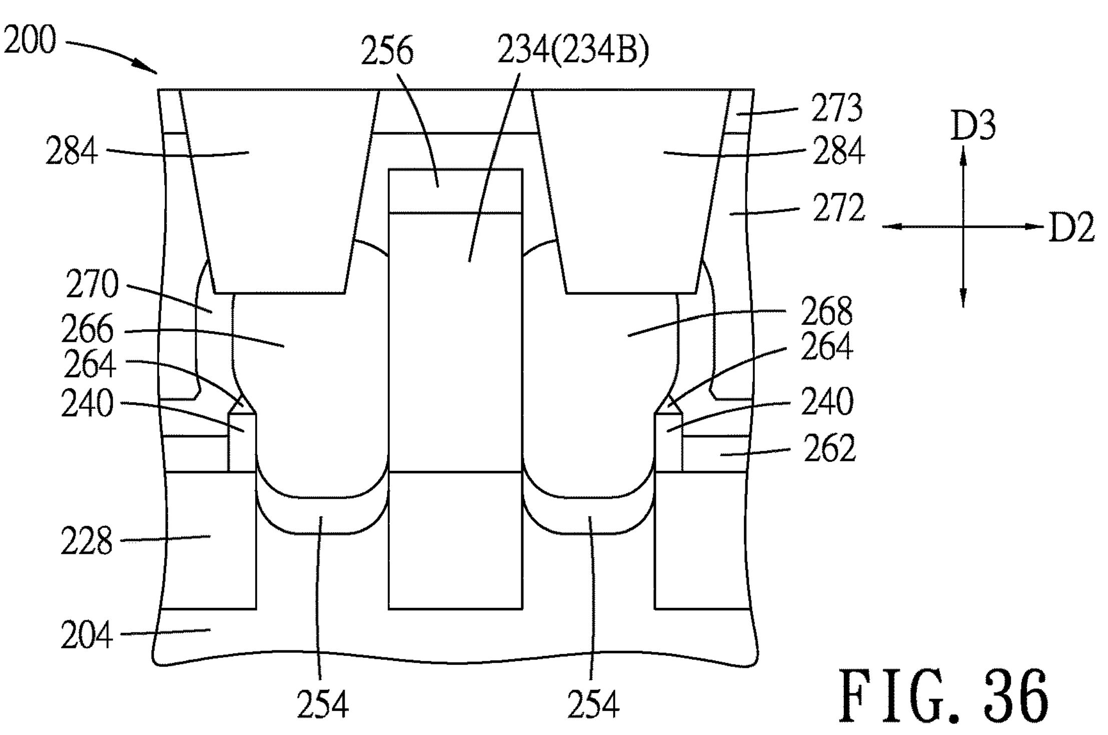
FIGS. 36 to 46 show different embodiments of the intermediate steps of a method for forming a semiconductor structure in accordance with some embodiments of this disclosure.
Figure 37:
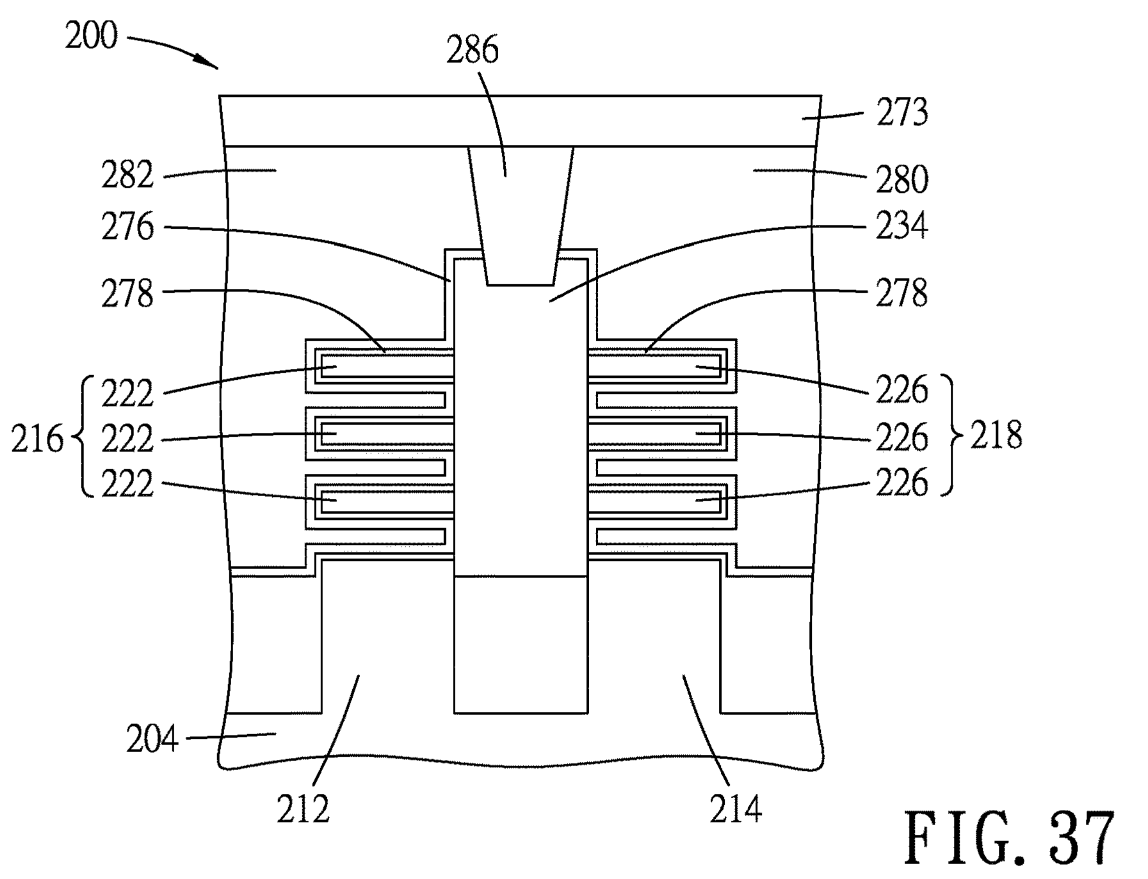

Referring to FIGS. 36 and 37 which are schematic sectional views respectively illustrating structures subsequent to FIGS. 34 to 35, in some embodiments, a plurality of contact structures 284 may be formed in the interlayer dielectric layer 272 to penetrate the contact etching stop layer 270, and to be respectively connected to the first and second epitaxial structures 266, 268. In some embodiments, an interlayer dielectric structure 273 may be formed over the interlayer dielectric layer 272, and the contact structures 284 are formed in the interlayer dielectric layer 272 and the interlayer dielectric structure 273. In some embodiments, the interlayer dielectric structure 273 may be made of a material identical to or similar to the material of the interlayer dielectric layer 272. In some embodiments, the contact structures 284 may be made of Cu, W, Co, Ru, Ti, TiN, Ta, TaN, Mo, Ni, Pt, or other suitable materials, and may be made by (i) patterning the structure shown in FIG. 34 to expose the first and second epitaxial structures 266, 268, (ii) depositing a material for forming the contact structures 284 using ALD, CVD, PVD, plating (e.g., electroplating, electroless plating, etc.), or other suitable techniques, and (iii) removing extra portions of the material to expose the interlayer dielectric layer 272 using CMP or other suitable techniques. In some embodiments, a gate separator 286 may be formed to separate the first and second gate structures 280, 282. In some other embodiments, the gate separator 286 may be omitted. In some embodiments, the gate separator 286 may further penetrate the gate dielectric layer 276 and extend into the separating wall 234. In some embodiments, the gate separator 286 may be made of an oxide-based material (e.g., SiOx, etc.), a nitride-based material (e.g., SiN, etc.), or other suitable materials, and may be formed by (i) patterning the structure shown in FIG. 34 to expose the first wall portion 234A, (ii) depositing a material for forming the gate separator 286 using ALD, CVD, PVD, or other suitable techniques (iii) removing extra portions of the material to expose the interlayer dielectric layer 272 using CMP or other suitable techniques.

Figure 38:
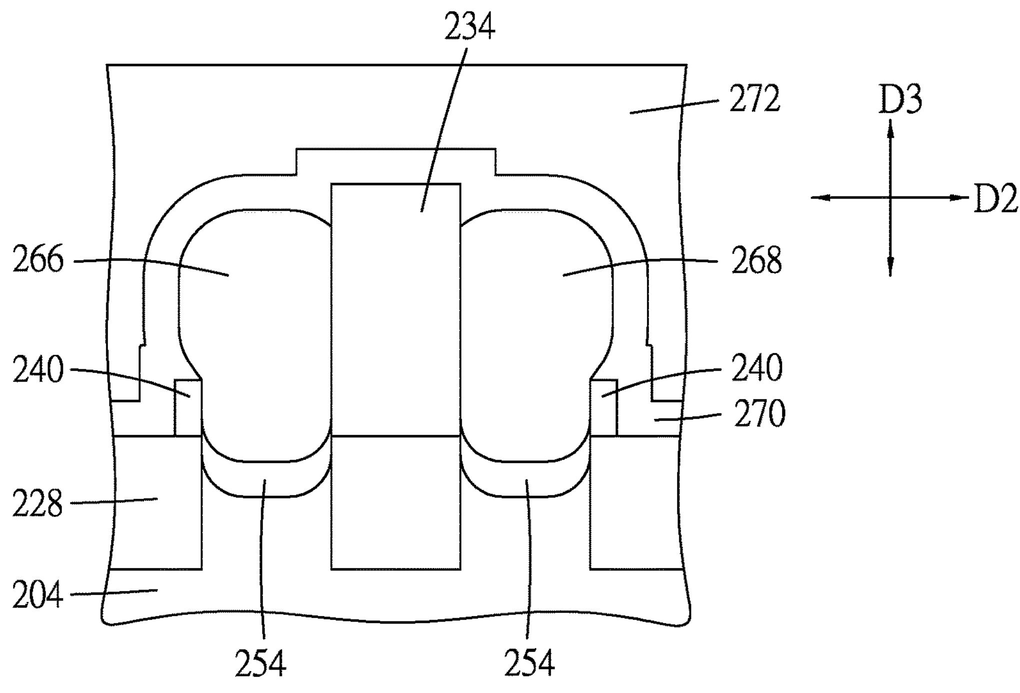

FIG. 38 is a variation from FIG. 34, where the top dielectric portion 256 of the dielectric structure 252 is formed over the separating wall 234, the side dielectric portion 262 of the dielectric structure 252 is formed over the isolation structure 228, and the minor portions 264 over the fin sidewalls 240 shown in FIG. 34 are removed from the structure of FIG. 38 using a suitable etching process (such as the examples described above), such that the bottom dielectric portions 254 of the dielectric structure 252 are left underneath the first and second epitaxial structures 266, 268. In some embodiments, the elements 256, 262, 264 shown in FIG. 34 may be removed after step 106 and before step 108 using a suitable etchant which has a relatively high etching rate to the elements 256, 262, 264 than to other elements (e.g., the first and second epitaxial structures 266, 268, the separating wall 234, and so on).

FIGS. 39 to 42 illustrate a first alternative method for forming the semiconductor structure in accordance with some of the embodiments. The alternative method is similar to the method 100 except that in the first alternative method, the dielectric structure 252 and the first and second epitaxial structures 266, 268 are formed by steps A1 to A5.

Figure 39:
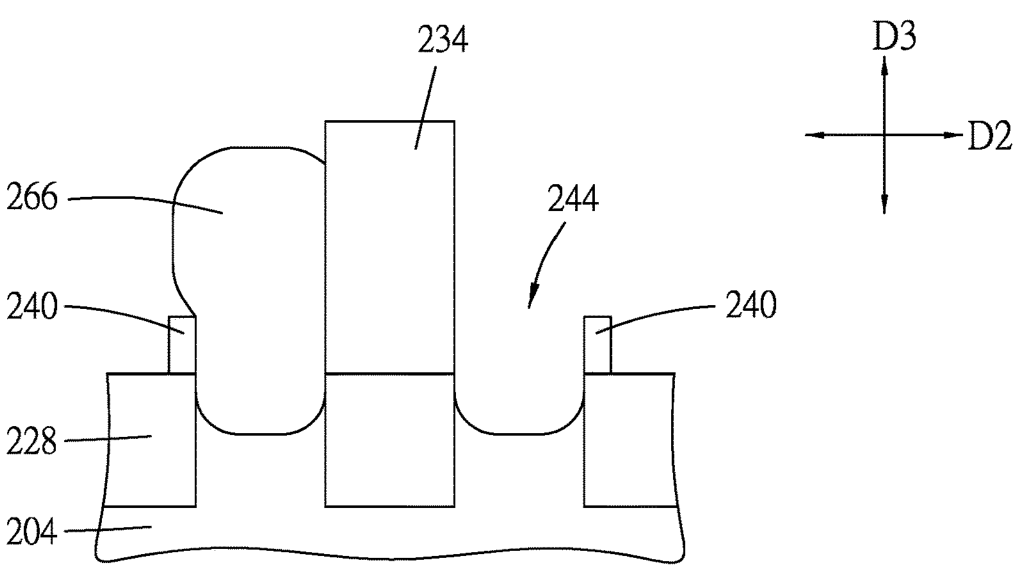

In step A1, referring to FIG. 39, the first epitaxial structures 266 are respectively formed in the first recesses 242 (see FIG. 12). In some embodiments, the first epitaxial structures 266 are formed in a manner similar to sub-steps 1061 to 1063.

Figure 40:
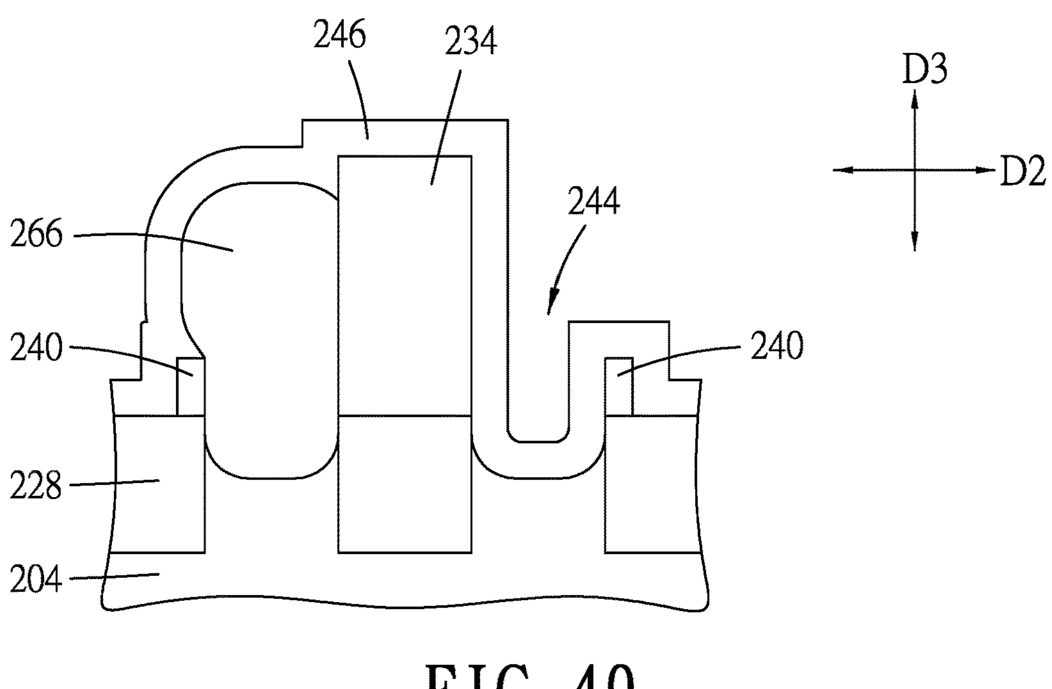

In step A2, referring to FIG. 40, the dielectric layer 246 is formed over the isolation structure 228, the fin sidewalls 240, the first epitaxial structures 266, the separating wall 234, and inner surfaces of the second recesses 244.

In step A3, the abovementioned directional treatment is applied to the dielectric layer 246 such that the horizontal portions of the dielectric layer 246 (e.g., the portions of the dielectric layer 246 on top surfaces of the first epitaxial structures 266 and the separating wall 234, bottom surfaces of the second recesses 244, and so on) are treated and vertical portions of the dielectric layer 246 (e.g., portions of the dielectric layer 246 on side walls of the fin sidewalls 240, the separating wall 234, and so on) are not treated or slightly treated. In some embodiments, steps A2 and A3 may be performed in a manner similar to sub-steps 1041, 1042.

Figure 41:
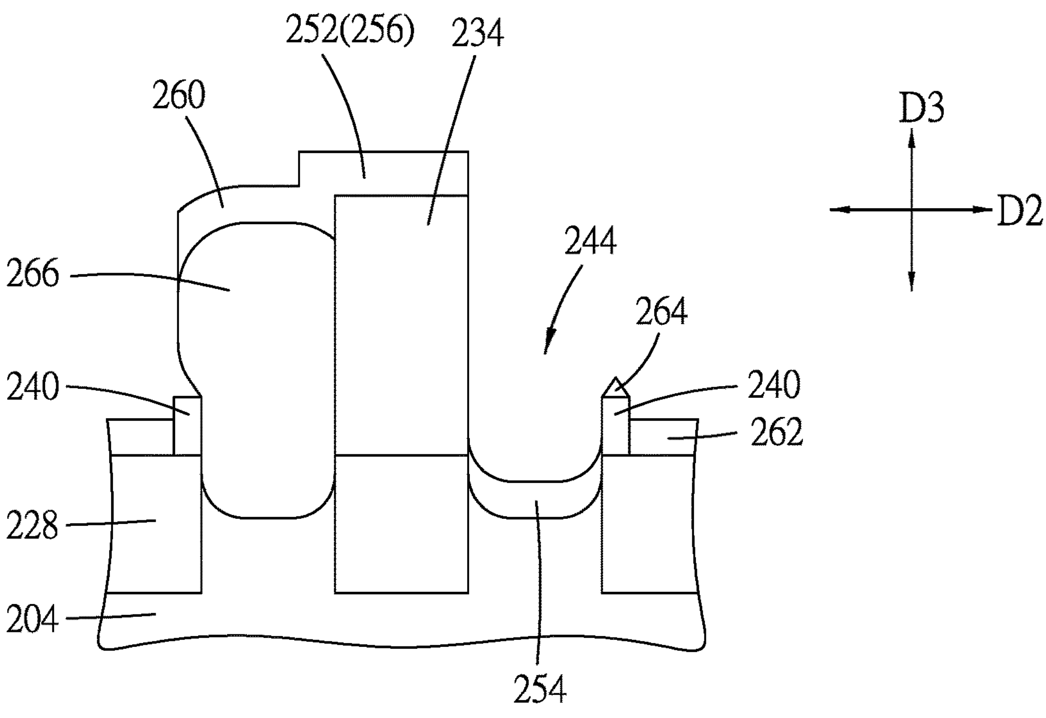

In step A4, referring to FIGS. 40 and 41, the untreated or slightly treated portions of the dielectric layer 246 are removed using a suitable etching process (such as the examples described above), thereby obtaining the dielectric structure 252 which includes the top dielectric portion 256, the side dielectric portion 262, the bottom dielectric portions 254, and the minor portions 264. The top dielectric portion 256 further includes two dielectric extensions 260 (one is schematically shown in FIG. 41) which respectively extend from the top dielectric segments 258 to respectively cover the first epitaxial structures 266. In some embodiments, step A4 is performed in a manner similar to sub-step 1043. Therefore, in the alternative method, the dielectric structure 252 is formed after formation of the first epitaxial structures 266 and before formation of the second epitaxial structures 268.

Figure 42:
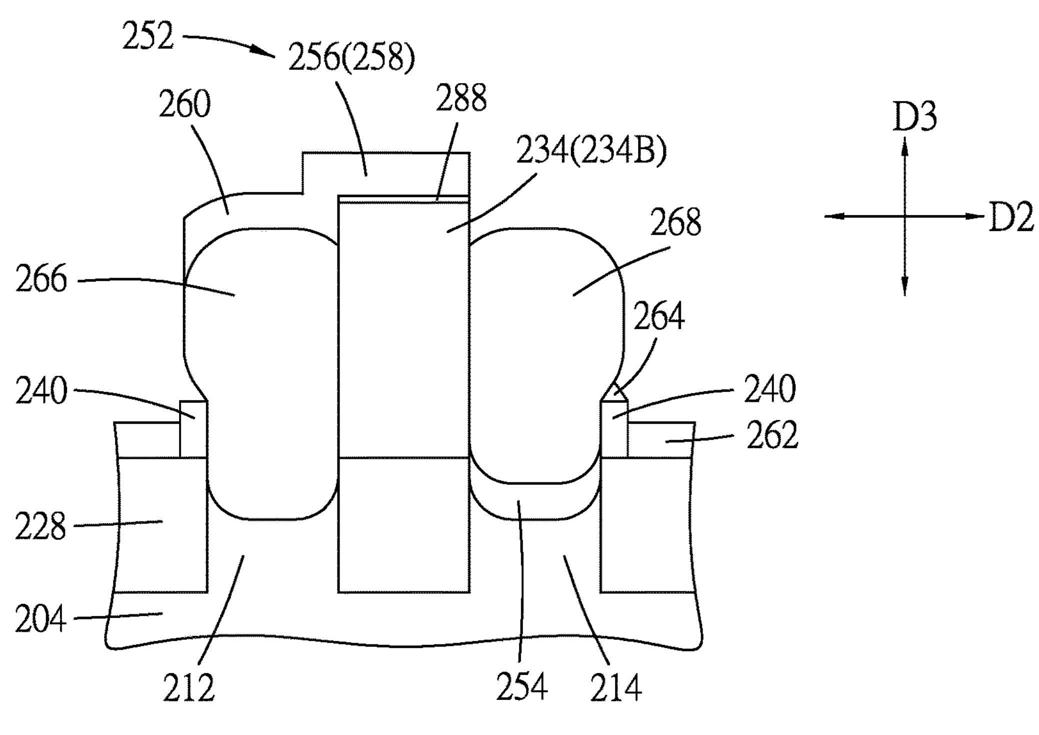

In step A5, referring to FIG. 42, the second epitaxial structures 268 are formed. In some embodiments, the second epitaxial structures 268 are formed in a manner similar to sub-steps 1064 to 1066. After step A5, steps 108 and 110 of the method 100 of FIG. 1 may be performed. In this embodiment, the bottom dielectric portions 254 are disposed to separate the second epitaxial structures 268 from the second fin 214, but the bottom dielectric portion 254 is absent between the first fin 212 and each of the first epitaxial structures 266.

In some other embodiments, after step A5 and before performing steps 108 and 110 of the method 100, the dielectric extensions 260 can be removed and the top dielectric segments 258 can be partially removed such that each of the remaining top dielectric segments 258 partially covers the corresponding one of the second wall portions 234B. In this case, after performing steps 108 and 110 of the method 100, the structure shown in FIG. 45 can be obtained.

Figure 43:
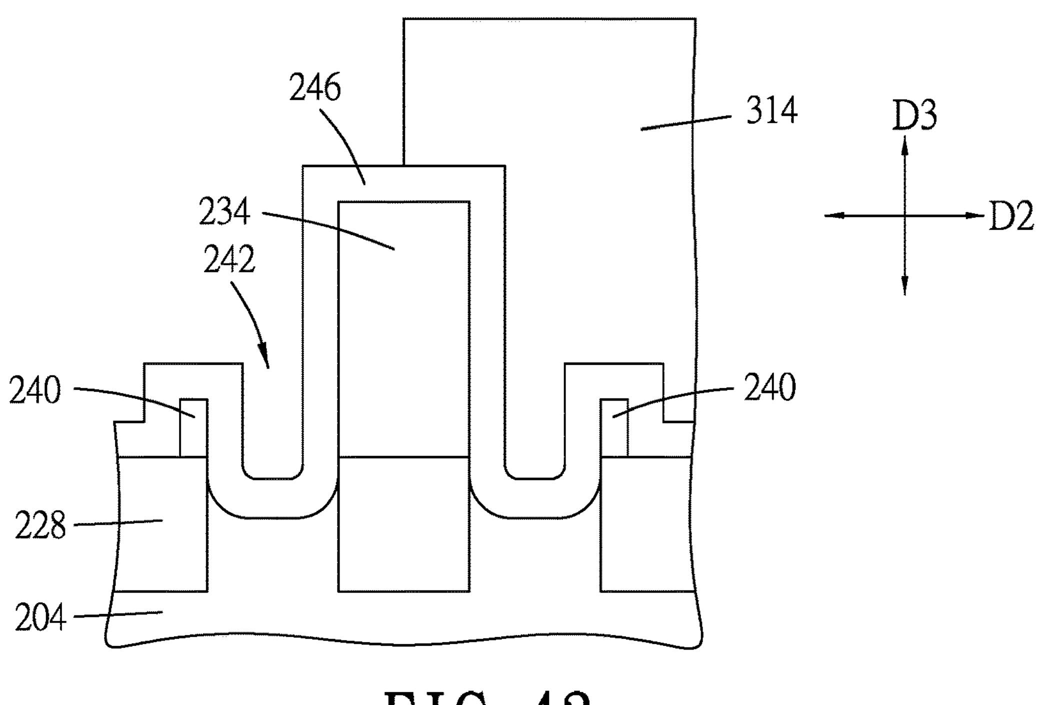
Figure 44:
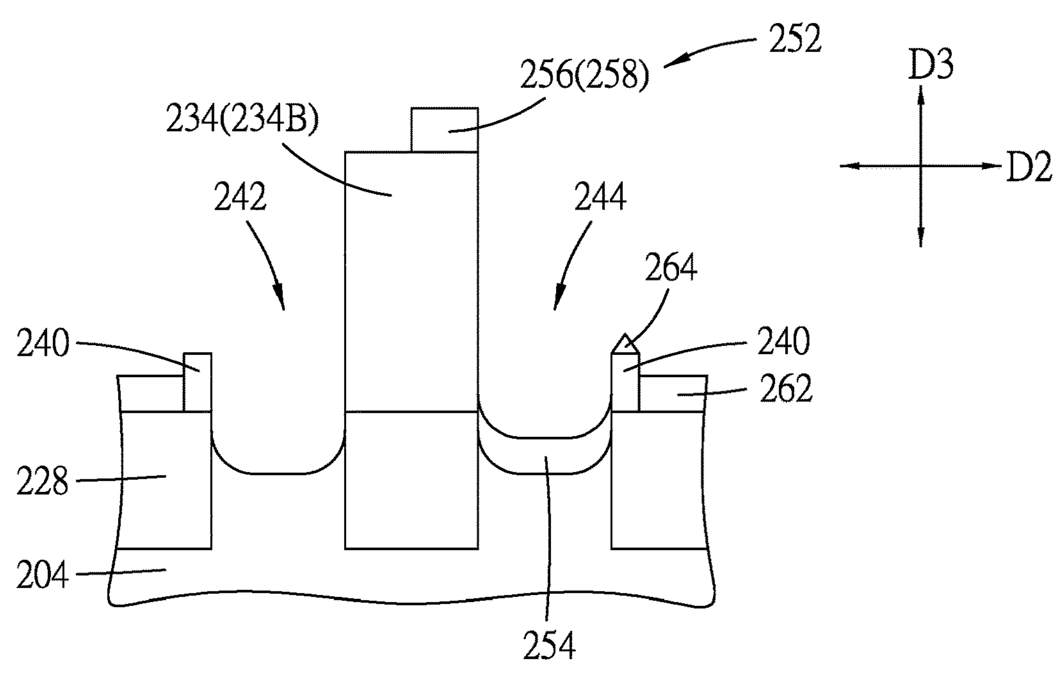
Figure 45:
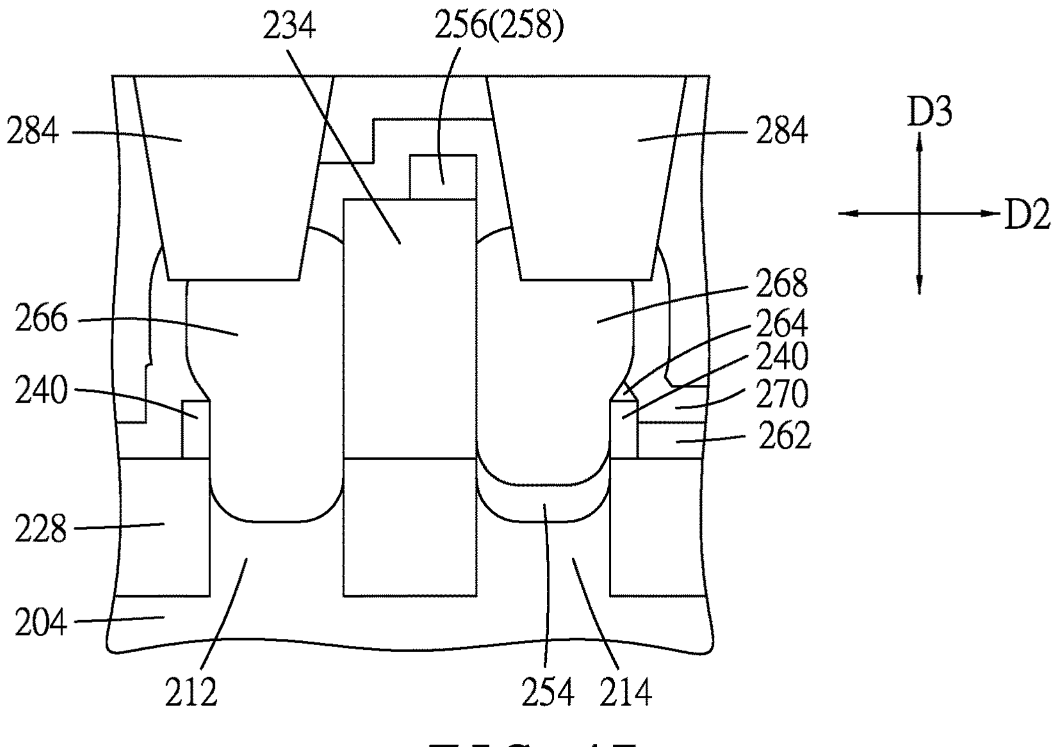

FIG. 43 to FIG. 45 illustrate a second alternative method for forming the semiconductor structure in accordance with some embodiments. The second alternative method is similar to the method 100 except that in the second alternative method, the dielectric structure 252 and the first and second epitaxial structures 266, 268 are formed by steps B1 to B7.

In step B1, referring to FIG. 43, the dielectric layer 246 is formed over the structure obtained after step 102 of the method 100. In some embodiments, step B1 is performed in a manner similar to sub-step 1041.

Figure 47:
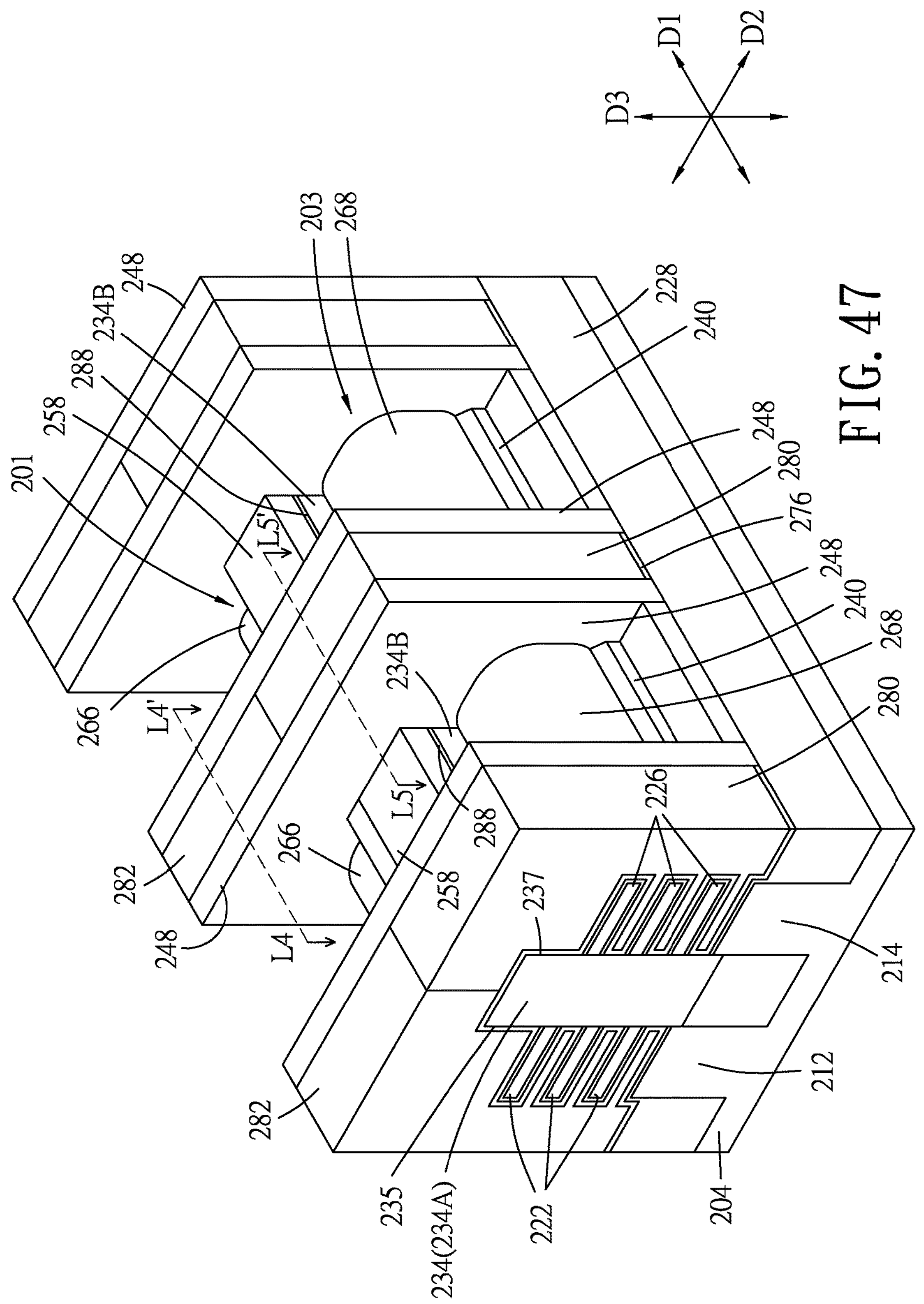
FIG. 47 is a schematic perspective view showing a semiconductor structure in accordance with some embodiments of this disclosure.

In step B2, a fourth mask feature 314 is formed to cover portions of the dielectric layer 246 in a position corresponding to the second device 203 shown in FIG. 47 (such as the right side of the dielectric layer 246 as shown in FIG. 43). Possible materials and processes for forming the fourth mask feature 314 are similar to those for the first mask feature 304 described above, the details thereof are omitted for the sake of brevity.

In step B3, referring to FIG. 43, the uncovered portions of the dielectric layer 246 shown in FIG. 43 is removed using a suitable etching process (such as the examples described above) and then the fourth mask feature 314 is removed using an ashing process or other suitable techniques.

In step B4, the abovementioned directional treatment is applied to the remaining dielectric layer 246 such that the horizontal portions of the remaining dielectric layer 246 (e.g., the portions of the dielectric layer 246 on top surfaces of the separating wall 234, bottom surfaces of the second recesses 244, and so on) are treated and vertical portions of the dielectric layer 246 (e.g., portions of the dielectric layer 246 on side walls of the fin sidewalls 240, the separating wall 234, and so on) are not treated or slightly treated. In some embodiments, step B4 is performed in a manner similar to sub-step 1042.

In step B5, the untreated or slightly treated portions of the dielectric layer 246 are removed using a suitable etching process (such as the examples described above), thereby obtaining the structure of FIG. 44. After step B5, the dielectric structure 252 includes (i) the top dielectric portion 256 that has the top dielectric segments 258 each of which partially covers a corresponding one of the second wall portions 234B of the separating wall 234, (ii) the bottom dielectric portions 254 that are respectively disposed on the bottom surfaces of the second recesses 244, and (iii) the minor portions 264 that are disposed over the fin sidewalls 240 adjacent to the second recesses 244.

In step B6, referring to FIGS. 44 and 45, the first epitaxial structures 266 are respectively formed in the first recesses 242. The first epitaxial structures 266 are formed in a manner similar to sub-steps 1061 to 1063.

In step B7, referring to FIGS. 44 and 45, the second epitaxial structures 268 are formed in the second recesses 244. In some embodiments, the second epitaxial structures 268 are formed in a manner similar to sub-steps 1064 to 1066. After step B7, steps 108 and 110 of the method 100 may be performed and then the contact structures 284 may be formed so as to obtain the structure shown in FIG. 45.

In some embodiments, as shown in FIG. 45, the top dielectric segments 258 (one of which is shown) are disposed proximate to the second epitaxial structures 268 (one of which is shown), and the bottom dielectric portions 254 are each disposed to separate a corresponding one of the second epitaxial structures 268 from the second fin 214. In some other embodiments, the structure shown in FIG. 45 may be made using a third alternative method similar to the second alternative method except that in the third alternative method, steps C1 to C3 are used to replace steps B2 to B5.

Figure 46:
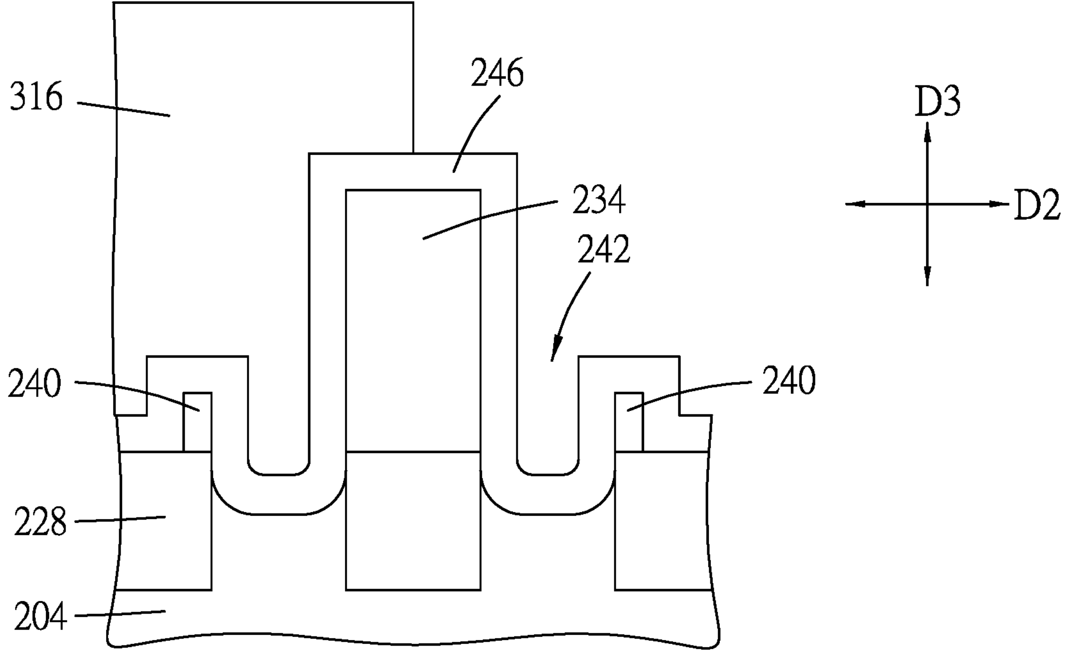

In step C1, as shown in FIG. 46, a fifth mask feature 316 is formed to cover portions of the dielectric layer 246 in a position corresponding to the first device 201 shown in FIG. 47 (the left side of the dielectric layer 246 as shown in FIG. 46). The fifth mask feature 316 is similar to the fourth mask feature 314 in terms of material, but is different from the fourth mask feature 314 in position.

In step C2, the abovementioned directional treatment is applied to the dielectric layer 246 not covered by the fifth mask feature 316, such that exposed horizontal portions of the remaining dielectric layer 246 (e.g., the exposed portions of the dielectric layer 246 on top surfaces of the separating wall 234, bottom surfaces of the second recesses 244, and so on) are treated and exposed vertical portions of the dielectric layer 246 (e.g., the exposed portions of the dielectric layer 246 on side walls of the fin sidewalls 240, the separating wall 234, and so on) are not treated or slightly treated. In some embodiments, step C2 is performed in a manner similar to sub-step 1042.

In step C3, the fifth mask feature 316 is removed using an ashing process or other suitable techniques, and the untreated portions of the dielectric layer 246 (including covered portions of the dielectric layer 246 and the untreated or slightly treated exposed portions of the dielectric layer 246) are removed using a suitable etching process (such as the examples described above), thereby also obtaining the structure shown in FIG. 44. Thereafter, steps B6 and B7 of the second alternative method and steps 108 and 110 may be performed, and the contact structures 284 may be formed, thereby obtaining the structure of FIG. 45.

FIG. 47 is a schematic perspective view of the semiconductor structure 200 in accordance with some embodiments of this disclosure, in which the side dielectric portion 262, the minor portions 264, the contact etching stop layer 270 and the interlayer dielectric layer 272 are omitted. FIG. 48 is a schematic sectional view taken from line L4-L4' of FIG. 47, illustrating the first device 201 in accordance with some embodiments and further illustrating the elements omitted in FIG. 47. FIG. 49 is a schematic sectional view taken from line L5-L5' of FIG. 47 illustrating the second device 203 in accordance with some embodiments and further illustrating the elements omitted in FIG. 47. Please note that the interfacial layers 278 and the gate dielectric layer 276 are omitted in FIGS. 48 and 49. In FIGS. 47 to 49, the semiconductor structure 200 may be made by the method 100, but not limited thereto.

Referring to FIGS. 47 to 49, in some embodiments, the semiconductor structure 200 includes the substrate 204, and the first and second fins 212, 214 disposed over the substrate 204. The first and second fins 212, 214 each extend along the first direction (D1), and are spaced apart from each other along the second direction (D2). In some embodiments, the semiconductor structure 200 further includes the separating wall 234 disposed over the substrate 204, and having a first wall surface 235 and a second wall surface 237 opposite to the first wall surface 235. In some embodiments, the semiconductor structure 200 further includes the first device 201 and the second device 203 which are respectively disposed on the first and second fins 212, 214. In some embodiments, the first device 201 includes a plurality of the first channel features 222 which extend away from the first wall surface 235 to be disposed over the first fin 212, and which are spaced apart from each other along the third direction (D3). In some embodiments, the first device 201 further includes two of the first epitaxial structures 266 which are formed on the first fin 212, and which are spaced apart from each other along the first direction (D1) such that each of the first channel features 222 interconnects the two first epitaxial structures 266. In some embodiments, the second device 203 includes a plurality of the second channel features 226 which extend away from the second wall surface 237 to be disposed over the second fin 214, and which are spaced apart from each other along the third direction (D3). In some embodiments, the second device 203 further includes two of the second epitaxial structures 268 which are formed on the second fin 214, and which are spaced apart from each other along the first direction (D1) such that each of the second channel features 226 interconnects the two second epitaxial structures 268. In some embodiments, the semiconductor structure 200 further includes the dielectric structure 252 which is disposed to electrically isolate the first epitaxial structures 266 of the first device 201 from the second epitaxial structures 268 of the second device 203. In some embodiments, the first device 201 further includes the first gate structure 282 which is disposed around the first channel features 222, and a portion of the gate dielectric layer 276 which is disposed to separate the first gate structure 282 from the first channel features 222; and the second device 202 further includes the second gate structure 280 which is disposed around the second channel features 226, and a remaining portion of the gate dielectric layer 276 which is disposed to separate the second gate structure 280 from the second channel features 226.

In some embodiments, as shown in FIG. 42 or 45, the bottom dielectric portions 254 may each be formed to separate the second epitaxial structure 268 from the second fin 214, such that a current leakage from one of the first and second epitaxial structures 266 through the first fin 212, the second fin 214 and the substrate 204 to the other one of the first and second epitaxial structures 266 may be minimized or prevented. As shown in FIGS. 47 to 49, in some other embodiments, the dielectric structure 252 includes a plurality of the bottom dielectric portions 254 so as to separate each of the first and second epitaxial structures 266, 268 from a corresponding one of the first and second fins 212, 214. Hence, the aforesaid current leakage can be further minimized or completely prevented.

Referring to FIGS. 26, 35, 42 and 47, in some embodiments, the separating wall 234 includes the first wall portion 234A which is disposed to separate the first channel features 222 from the second channel features 226, and two of the second wall portions 234B which are disposed at two opposite sides of the first wall portion 234A, where each of the second wall portions 234B is disposed to separate one of the first epitaxial structures 266 from a corresponding one of the second epitaxial structures 268. In some embodiments, the dielectric structure 252 further includes the top dielectric portion 256 having the two top dielectric segments 258 which are respectively formed on the second wall portions 234B so as to prevent the first epitaxial structures 266 from being merged with the second epitaxial structures 268. In some embodiments, a top surface of each of the second wall portions 234B is at a level lower than a top surface of the first wall portion 234A. In some embodiments, a top surface of each of the top dielectric segments 258 is at a level higher than a top surface of the first wall portion 234A. In some embodiments, the top dielectric portion 256 further includes two dielectric extensions 260 (one of which is shown in FIG. 42) which respectively extend from the top dielectric segments 258 to respectively cover the first epitaxial structures 266. In some embodiments, the semiconductor structure 200 may further include two oxide layers 288 each of which is connected between one of the top dielectric segments 258 and a corresponding one of the second wall portions 234B. In some embodiments, the oxide layers 288 may be native oxide formed after the formation of the second wall portions 234B and prior to the formation of the top dielectric segments 258. In some embodiments, a thickness of the top dielectric portion 256 measured along the third direction (D3) is smaller than a thickness of each of the bottom dielectric portions 254 along the third direction (D3). In some embodiments, the thickness of top dielectric portion 256 may range from about 1 nm to about 20 nm, but other ranges of values are also within the scope of this disclosure. In some embodiments, if the thickness of the top dielectric portion 256 is too small, such as smaller than about 1 nm, the top dielectric portion 256 may not be able to prevent the abovementioned merging of epitaxial structures. In some embodiments, if the thickness of the top dielectric portion 256 is too large, such as greater than about 20 nm, the manufacturing cost of the device may be increased, since a thicker top dielectric portion 256 will need to be deposited. In some embodiments, the thickness of each of the bottom dielectric portions 254 may range from about 1 nm to about 20 nm, but other ranges of values are also within the scope of this disclosure. In some embodiments, if the thickness of each of the bottom dielectric portions 254 is too small, such as smaller than about 1 nm, the bottom dielectric portion 254 may not be able to prevent the abovementioned current leakage. In some embodiments, if the thickness of each of the bottom dielectric portions 254 is too large, such as larger than about 20 nm, volumes of the first and/or second epitaxial structures 266, 268 may be insufficient, and in addition, one of the first and second recesses 242, 244 (see FIG. 12) may need to be formed deeper to accommodate the thick bottom dielectric portion 254. Such deep recess may damage ambient structures.

The embodiments of the present disclosure have some advantageous features. The top dielectric segments 258 of the top dielectric portion 256 of the dielectric structure 252 may prevent the first epitaxial structures 266 from being merged with the second epitaxial structures 268. In addition, the bottom dielectric portions 254 of the dielectric structure 252 may prevent current leakage from one of the first and second epitaxial structures 266 to the other one of the first and second epitaxial structures 266. Moreover, by having the side dielectric portion 262 of the dielectric structure 252 covering over the isolation structure 228 may protect the isolation structure 228 during manufacturing of the semiconductor structure 200.

In accordance with some embodiments of the present disclosure, a semiconductor structure includes a substrate, a first fin, a second fin, a separating wall, a plurality of first channel features, a plurality of second channel features, two first epitaxial structures, two second epitaxial structures, and a dielectric structure. The first fin is disposed over the substrate. The second fin is disposed over the substrate, and is spaced apart from the first fin. The separating wall is disposed over the substrate, and has a first wall surface and a second wall surface opposite to the first wall surface. The first channel features extend away from the first wall surface to be disposed over the first fin such that the first channel features are spaced apart from each other. The second channel features extend away from the second wall surface to be disposed over the second fin such that the second channel features are spaced apart from each other. The first epitaxial structures are formed on the first fin, and are spaced apart from each other such that each of the first channel features interconnects the first epitaxial structures. The second epitaxial structures are formed on the second fin, and are spaced apart from each other such that each of the second channel features interconnects the second epitaxial structures. The dielectric structure includes at least one bottom dielectric portion that is disposed to separate at least one of the first and second epitaxial structures from a corresponding one of the first and second fins.

In accordance with some embodiments of the present disclosure, the dielectric structure is made of $SiO_2$, SiN, SiCN, SiCON, SiCO, AlO, HfO, or a high-k material.

In accordance with some embodiments of the present disclosure, the dielectric structure includes a plurality of the bottom dielectric portions so as to separate each of the first and second epitaxial structures from a corresponding one of the first and second fins.

In accordance with some embodiments of the present disclosure, the separating wall includes a first wall portion which is disposed to separate the first channel features from the second channel features, and two second wall portions which are disposed at two opposite sides of the first wall portion. Each of the second wall portions is disposed to separate one of the first epitaxial structures from a corresponding one of the second epitaxial structures. The dielectric structure further includes a top dielectric portion having two top dielectric segments which are respectively formed on the second wall portions so as to prevent the first epitaxial structures from being merged with the second epitaxial structures.

In accordance with some embodiments of the present disclosure, a top surface of each of the second wall portions is at a level lower than a top surface of the first wall portion. A top surface of each of the top dielectric segments is at a level higher than a top surface of the first wall portion.

In accordance with some embodiments of the present disclosure, the top dielectric portion further includes two dielectric extensions which respectively extend from the top dielectric segments to respectively cover the first epitaxial structures. The dielectric structure includes two of the bottom dielectric portions that are respectively disposed to separate the second epitaxial structures from the second fin.

In accordance with some embodiments of the present disclosure, each of the top dielectric segments partially covers a top surface of a respective one of the second wall portions.

In accordance with some embodiments of the present disclosure, the semiconductor structure further includes two oxide layers each of which is connected between one of the top dielectric segments and a corresponding one of the second wall portions.

In accordance with some embodiments of the present disclosure, a thickness of the top dielectric portion is smaller than a thickness of the at least one bottom dielectric portion.

In accordance with some embodiments of the present disclosure, each of the top dielectric portion and the at least one bottom dielectric portion has a thickness ranging from 1 nm to 20 nm.

In accordance with some embodiments of the present disclosure, the semiconductor structure further includes an isolation structure that is disposed over the substrate and that surrounds the first and second fins. The dielectric structure further includes a side dielectric portion that is disposed over the isolation structure.

In accordance with some embodiments of the present disclosure, a semiconductor structure includes a substrate, a first fin, a second fin, a separating wall, a first device, a second device, and a dielectric structure. The first and second fins are disposed over the substrate, and are spaced apart from each other. The separating wall is disposed over the substrate, and has a first wall surface and a second wall surface opposite to the first wall surface. The first and second devices are respectively disposed on the first and second fins. Each of the first and second devices includes: a plurality of channel features which extend away from a corresponding one of the first and second wall surfaces to be disposed over a corresponding one of the first and second fins, and which are spaced apart from each other; and two epitaxial structures which are formed on a corresponding one of the first and second fins, and which are spaced apart from each other such that each of the channel features interconnects the two epitaxial structures. The dielectric structure is disposed to electrically isolate the epitaxial structures of the first device from the epitaxial structures of the second device.

In accordance with some embodiments of the present disclosure, each of the first and second devices further includes a gate structure disposed around the channel features, and a gate dielectric layer disposed to separate the gate structure from the channel features.

In accordance with some embodiments of the present disclosure, the semiconductor structure further includes a gate separator disposed to separate the gate structure of the first device from the gate structure of the second device.

In accordance with some embodiments of the present disclosure, a method of forming a semiconductor structure includes: forming first and second fins over a substrate such that the first and second fins are spaced apart from each other; forming a separating wall over the substrate; forming a plurality of first channel features on a first wall surface of the separating wall such that the first channel features are spaced apart from each other; forming a plurality of second channel features on a second wall surface of the separating wall opposite to the first wall surface such that the second channel features are spaced apart from each other; forming two first epitaxial structures on the first fin such that each of the first channel features interconnects the first epitaxial structures; forming two second epitaxial structures on the first fin such that each of the second channel features interconnects the second epitaxial structures; and forming a dielectric structure to isolate the first epitaxial structures from the second epitaxial structures.

In accordance with some embodiments of the present disclosure, the dielectric structure includes two bottom dielectric portions each of which is disposed to separate a corresponding one of the second epitaxial structures from the second fin so as to electrically isolate lower portions of the second epitaxial structures from lower portions of the first epitaxial structures, and each of which is formed before forming the second epitaxial structures.

In accordance with some embodiments of the present disclosure, the separating wall includes a first wall portion formed to separate the first channel features from the second channel features, and two second wall portions at two opposite sides of the first wall portion. Each of the second wall portions is formed to separate one of the first epitaxial structures from a corresponding one of the second epitaxial structures. The dielectric portion further includes a top dielectric portion having two top dielectric segments which are respectively formed on the second wall portions so as to prevent upper portions of the first epitaxial structures from being merged with upper portions of the second epitaxial structures.

In accordance with some embodiments of the present disclosure, the top dielectric portion further has two dielectric extensions which respectively extend from the top dielectric segments to respectively cover the first epitaxial structures. The dielectric structure is formed after formation of the first epitaxial structures and before formation of the second epitaxial structures.

In accordance with some embodiments of the present disclosure, forming the dielectric structure includes: forming a dielectric layer to conformally cover the first epitaxial structures, the second wall portions of the separating wall, and two exposed portions of the second fin; directionally treating the dielectric layer such that the dielectric layer has a treated portion which serves as the top dielectric portion and the two bottom dielectric portions, and an untreated portion; and removing the untreated portion.

In accordance with some embodiments of the present disclosure, the method further includes removing the two dielectric extensions and partially removing the top dielectric segments such that each of the remaining top dielectric segments partially covers the corresponding one of the second wall portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure comprising:

forming a first active region and a second active region over a substrate such that the first active region and the second active region are spaced apart from each other;

forming a separating wall over the substrate;

forming first channel features on a first wall surface of the separating wall such that the first channel features are spaced apart from each other;

forming second channel features on a second wall surface of the separating wall opposite to the first wall surface such that the second channel features are spaced apart from each other;

forming two first epitaxial structures on the first active region such that each of the first channel features interconnects the two first epitaxial structures;

forming two second epitaxial structures on the second active region such that each of the second channel features interconnects the two second epitaxial structures; and forming a dielectric structure to isolate the two first epitaxial structures from the two second epitaxial structures, wherein the separating wall includes a first wall portion formed to separate the first channel features from the second channel features, and two second wall portions at two opposite sides of the first wall portion, each of the second wall portions being formed to separate one of the two first epitaxial structures from a corresponding one of the two second epitaxial structures, wherein the dielectric structure further includes a top dielectric portion having two top dielectric segments which are respectively formed on the two second wall portions so as to prevent upper portions of the two first epitaxial structures from being merged with upper portions of the two second epitaxial structures, wherein the top dielectric portion further has two dielectric extensions which respectively extend from the two top dielectric segments to respectively cover the two first epitaxial structures, and wherein the dielectric structure is formed after formation of the two first epitaxial structures and before formation of the two second epitaxial structures.

2. The method as claimed in claim 1, wherein the dielectric structure further includes two bottom dielectric portions each of which is disposed to separate a corresponding one of the two second epitaxial structures from the second active region so as to electrically isolate lower portions of the two second epitaxial structures from lower portions of the two first epitaxial structures, each of the two bottom dielectric portions being formed before forming the two second epitaxial structures.

3. The method as claimed in claim 1, wherein forming the dielectric structure includes:

forming a dielectric layer to conformally cover the two first epitaxial structures, the two second wall portions of the separating wall, and two exposed portions of the second active region;

directionally treating the dielectric layer such that the dielectric layer has a treated portion which serves as the top dielectric portion and the two bottom dielectric portions, and an untreated portion; and removing the untreated portion.

4. The method as claimed in claim 3, further comprising removing the two dielectric extensions and partially removing the two top dielectric segments such that each of the remaining top dielectric segments partially covers the corresponding one of the two second wall portions.

5. The method as claimed in claim 3, wherein directionally treating the dielectric layer is performed by introducing nitrogen, carbon, oxygen, or combinations thereof into the dielectric layer.

6. The method as claimed in claim 3, wherein:

forming the dielectric layer includes depositing a dielectric material; and depositing the dielectric material and directionally treating the dielectric layer are performed in a cyclical manner.

7. A method of forming a semiconductor structure comprising:

forming a first stacked structure and a second stacked structure over two active regions, respectively, the two active regions being spaced apart from each other and surrounded by an isolation structure;

forming a separating wall interconnecting the first stacked structure and the second stacked structure;

forming a dummy gate structure over the isolation structure, the first stacked structure, the second stacked structure, and the separating wall, each of the first stacked structure, the second stacked structure and the separating wall having two portions exposed from the dummy gate structure;

removing the two portions of the first stacked structure to form first recesses, and removing the two portions of the second stacked structure to form second recesses;

forming a dielectric layer over the first recesses, the second recesses, the two portions of the separating wall, the isolation structure and the dummy gate structure;

removing vertical portions of the dielectric layer, and leaving at least one of horizontal portions of the dielectric layer;

forming first epitaxial structures in the first recesses, respectively; and forming second epitaxial structures in the second recesses, respectively.

8. The method as claimed in claim 7, wherein forming the dielectric layer includes depositing a dielectric material that serves as the dielectric layer, and performing a directional treatment to treat the horizontal portions of the dielectric layer.

9. The method as claimed in claim 8, wherein forming the dielectric layer includes multiple repetitions of both deposition of the dielectric material and the directional treatment.

10. The method as claimed in claim 8, wherein the directional treatment introduces nitrogen, carbon, oxygen, or combinations thereof into the horizontal portions of the dielectric layer.

11. The method as claimed in claim 10, wherein the directional treatment includes an ion implantation, a plasma treatment, or a radical treatment.

12. The method as claimed in claim 7, wherein the horizontal portions of the dielectric layer includes:

bottom dielectric portions that are formed in the first recesses or the second recesses;

a top dielectric portion that is formed over the separating wall;

a side dielectric portion that is formed over the isolation structure; and a covering dielectric portion formed over the dummy gate structure and the gate spacers.

13. The method as claimed in claim 12, further comprising:

depositing an interlayer dielectric material over the first epitaxial structures and the second epitaxial structures; and performing a planarization process to remove an excess amount of the interlayer dielectric material so as to form an interlayer dielectric layer, and to remove the covering dielectric portion so as to expose the dummy gate structure.

14. A method of forming a semiconductor structure comprising:

forming a semiconductor feature which includes a first active region and a second active region, each of which extends in a first direction, the first active region and the second active region being spaced apart from each other in a second direction different from the first direction, an isolation structure disposed around the first active region and the second active region, a patterned first stacked structure and a patterned second stacked structure that are disposed on the first active region and the second active region, respectively, a separating wall disposed on the isolation structure and interconnecting the patterned first stacked structure and the patterned second stacked structure, and a dummy gate structure extending lengthwise in the second direction, and disposed over the first active region, the second active region, the isolation structure, the patterned first stacked structure, the patterned second stacked structure and the separating wall, the first active region having two portions located on opposite sides of the dummy gate structure and exposed to first recesses, respectively, the second active region having two portions located on opposite sides of the dummy gate structure and exposed to second recesses, respectively, the separating wall having a first wall portion covered by the dummy gate structure, and two second wall portions exposed from the dummy gate structure;

depositing a dielectric layer over the semiconductor feature;

performing a directional treatment to treat horizontal portions of the dielectric layer;

removing vertical portions of the dielectric layer;

forming first epitaxial structures in the first recesses, respectively; and forming second epitaxial structures in the second recesses, respectively.

15. The method as claimed in claim 14, wherein the directional treatment is performed after deposition of the dielectric layer, and before removal of the vertical portions.

16. The method as claimed in claim 15, wherein deposition of the dielectric layer, the directional treatment, and removal of the vertical portions are performed before forming the first epitaxial structures and the second epitaxial structures, the dielectric layer covering the second wall portions, the two portions of the first active region, the two portions of the second active region, and the isolation structure.

17. The method as claimed in claim 16, further comprising: after deposition of the dielectric layer and before performing the directional treatment, forming a mask feature that covers portions of the dielectric layer corresponding to the second recesses, leaving portions of the dielectric layer corresponding to the first recesses exposed from the mask feature;

performing a removing process to remove the portions of the dielectric layer that are exposed from the mask feature; and after the removing process, removing the mask feature.

18. The method as claimed in claim 16, further comprising:

after deposition of the dielectric layer and before performing the directional treatment, forming a mask feature that covers portions of the dielectric layer corresponding to the first recesses, leaving portions of the dielectric layer corresponding to the second recesses exposed from the mask feature; and after performing the directional treatment, and before removal of the vertical portions, removing the mask feature, wherein the portions of the dielectric layer exposed from the mask feature are untreated in the direction treatment, and removed in removing the vertical portions.

19. The method as claimed in claim 15, wherein:

deposition of the dielectric layer, the directional treatment, and removal of the vertical portions are performed after forming the first epitaxial structures, and before forming the second epitaxial structures; and after removal of the vertical portions, the horizontal portions cover the second wall portions, the first epitaxial structures, the two portions of the second active region, and the isolation structure, respectively.

20. The method as claimed in claim 19, wherein the second epitaxial structures are formed in the second recesses and on two corresponding ones of the horizontal portions that cover the two portions of the second active region, respectively.

* * * * *